(12) United States Patent
Hsu et al.

(10) Patent No.: US 8,318,046 B2
(45) Date of Patent: *Nov. 27, 2012

(54) WATER DISPERSIBLE POLYANILINES MADE WITH POLYMERIC ACID COLLOIDS FOR ELECTRONICS APPLICATIONS

(75) Inventors: Che-Hsiung Hsu, Wilmington, DE (US); Frank P. Uckert, Buellton, CA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/275,413

(22) Filed: Nov. 21, 2008

(65) Prior Publication Data

US 2009/0072201 A1   Mar. 19, 2009

Related U.S. Application Data

(62) Division of application No. 10/669,577, filed on Sep. 24, 2003, now Pat. No. 7,462,298.

(60) Provisional application No. 60/413,203, filed on Sep. 24, 2002.

(51) Int. Cl.
 *H01B 1/00* (2006.01)
(52) U.S. Cl. ........................................ 252/500
(58) Field of Classification Search ............ 252/500
 See application file for complete search history.

(56) References Cited

U.S. PATENT DOCUMENTS

| | | | |
|---|---|---|---|
| 3,282,875 A | 11/1966 | Connolly et al. | |
| 4,321,114 A | 3/1982 | MacDiarmid et al. | |
| 4,356,429 A | 10/1982 | Tang | |
| 4,358,545 A | 11/1982 | Ezzell et al. | |
| 4,433,082 A | 2/1984 | Grot | |
| 4,442,187 A | 4/1984 | MacDiarmid et al. | |
| 4,539,507 A | 9/1985 | VanSlyke et al. | |
| 4,552,927 A | 11/1985 | Warren | |
| 4,731,408 A | 3/1988 | Jasne | |
| 4,795,543 A | 1/1989 | Stetter et al. | |
| 4,869,979 A | 9/1989 | Ohtani et al. | |
| 4,889,659 A | 12/1989 | Genies | |
| 4,933,106 A | 6/1990 | Sakai et al. | |
| 4,940,525 A | 7/1990 | Ezzell et al. | |
| 4,959,430 A | 9/1990 | Jonas et al. | |
| 4,973,391 A | 11/1990 | Madou et al. | |
| 4,987,042 A | 1/1991 | Jonas et al. | |
| 5,002,700 A | 3/1991 | Otagawa et al. | |
| 5,035,926 A | 7/1991 | Jonas et al. | |
| 5,069,820 A | 12/1991 | Jen et al. | |
| 5,115,057 A | 5/1992 | Ono et al. | |
| 5,160,457 A | 11/1992 | Elsenbaumer et al. | |
| 5,185,100 A | 2/1993 | Han et al. | |
| 5,247,190 A | 9/1993 | Friend et al. | |
| 5,258,461 A | 11/1993 | Facci et al. | |
| 5,286,413 A | 2/1994 | Hannecart | |
| 5,294,504 A | 3/1994 | Otagawa et al. | |
| 5,300,575 A | 4/1994 | Jonas | |
| 5,312,681 A | 5/1994 | Muys | |
| 5,317,169 A | 5/1994 | Nakano et al. | |
| 5,354,613 A | 10/1994 | Quintens et al. | |
| 5,370,981 A | 12/1994 | Krafft et al. | |
| 5,372,924 A | 12/1994 | Quintens et al. | |
| 5,378,402 A | 1/1995 | Cross et al. | |
| 5,378,403 A | 1/1995 | Shacklette et al. | |
| 5,408,109 A | 4/1995 | Heeger et al. | |
| 5,463,005 A | 10/1995 | Desmarteau | |
| 5,489,400 A | 2/1996 | Liu et al. | |
| 5,537,000 A | 7/1996 | Alivisatos et al. | |
| 5,554,179 A | 9/1996 | Stroetmann et al. | |
| 5,567,356 A | 10/1996 | Kinlen | |
| 5,578,249 A * | 11/1996 | Ohtani et al. | 252/519.21 |
| 5,585,038 A | 12/1996 | Kirmanen et al. | |
| 5,705,888 A | 1/1998 | Staring et al. | |
| 5,716,550 A | 2/1998 | Gardner et al. | |
| 5,723,873 A | 3/1998 | Yang | |
| 5,766,515 A | 6/1998 | Jonas et al. | |
| 5,773,150 A | 6/1998 | Tong et al. | |
| 5,792,830 A | 8/1998 | Noding et al. | |
| 5,798,170 A | 8/1998 | Zhang et al. | |
| 5,863,465 A | 1/1999 | Kinlen | |
| 5,869,350 A | 2/1999 | Heeger et al. | |
| 5,910,385 A | 6/1999 | Gardner et al. | |
| 5,917,279 A | 6/1999 | Elschner et al. | |
| 5,965,281 A | 10/1999 | Cao | |
| 5,986,400 A | 11/1999 | Staring et al. | |
| 5,994,496 A | 11/1999 | Van Haare et al. | |
| 6,004,483 A | 12/1999 | Jonas et al. | |
| 6,018,018 A | 1/2000 | Samuelson et al. | |
| 6,083,635 A | 7/2000 | Jonas et al. | |
| 6,097,147 A | 8/2000 | Baldo et al. | |
| 6,136,909 A | 10/2000 | Liao et al. | |
| 6,150,426 A | 11/2000 | Curtin et al. | |
| 6,197,418 B1 | 3/2001 | Cloots et al. | |
| 6,205,016 B1 | 3/2001 | Niu | |
| 6,210,790 B1 | 4/2001 | Crivello | |
| 6,225,040 B1 | 5/2001 | Muys et al. | |
| RE37,370 E | 9/2001 | Cao | |
| 6,303,238 B1 | 10/2001 | Thompson et al. | |
| 6,303,943 B1 | 10/2001 | Yu et al. | |
| 6,319,428 B1 | 11/2001 | Michot et al. | |
| 6,324,091 B1 | 11/2001 | Gryko et al. | |
| 6,337,370 B1 | 1/2002 | Bae et al. | |
| 6,340,496 B1 | 1/2002 | Cloots et al. | |

(Continued)

FOREIGN PATENT DOCUMENTS

CN      1274869 A      11/2000

(Continued)

OTHER PUBLICATIONS

CRC Handbook of Chemistry and Physics, 81st Edition (2000-2001) (Book Not Included).

(Continued)

Primary Examiner — Camie Thompson

(57) ABSTRACT

Methods are provided to producing stable, aqueous dispersions of polyaniline and colloid-forming polymeric acids. Films from the disclosed compositions are useful as buffer layers, in organic electronic devices including electroluminescent devices, such as organic light emitting diodes (OLED) displays. Films cast from the compositions are also useful in combination with nanometal wires or carbon nanotubes in applications such as drain, source, or gate electrodes in thin film field effect transistors.

19 Claims, 1 Drawing Sheet

U.S. PATENT DOCUMENTS

| | | |
|---|---|---|
| 6,358,437 B1 | 3/2002 | Jonas |
| 6,376,105 B1 | 4/2002 | Jonas et al. |
| 6,391,481 B1 | 5/2002 | Jonas |
| 6,452,711 B1 | 9/2002 | Heuer |
| 6,507,428 B1 | 1/2003 | Heuer et al. |
| 6,515,314 B1 | 2/2003 | Duggal et al. |
| 6,593,690 B1 | 7/2003 | McCormick et al. |
| 6,611,096 B1 | 8/2003 | McCormick et al. |
| 6,632,472 B2 | 10/2003 | Louwet et al. |
| 6,670,645 B2 | 12/2003 | Grushin et al. |
| 6,706,963 B2 | 3/2004 | Gaudiana et al. |
| 6,717,358 B1 | 4/2004 | Liao et al. |
| 6,756,474 B2 * | 6/2004 | Hsu ................... 528/422 |
| 6,830,828 B2 | 12/2004 | Thompson et al. |
| 6,875,523 B2 | 4/2005 | Grushin et al. |
| 6,923,881 B2 | 8/2005 | Tateishi et al. |
| 6,924,047 B2 | 8/2005 | Radu et al. |
| 6,963,005 B2 | 11/2005 | Lecloux et al. |
| 7,112,369 B2 | 9/2006 | Wang et al. |
| 7,166,010 B2 | 1/2007 | Lamansky et al. |
| 7,189,771 B2 | 3/2007 | Hsu |
| 7,202,369 B2 | 4/2007 | Baik et al. |
| 7,211,202 B2 * | 5/2007 | Korzhenko et al. ........... 252/500 |
| 7,211,824 B2 | 5/2007 | Lazarev |
| 7,244,797 B2 | 7/2007 | Kurihara et al. |
| 7,250,461 B2 | 7/2007 | Hsu et al. |
| 7,307,276 B2 | 12/2007 | Andriessen |
| 7,317,047 B2 | 1/2008 | Hsu |
| 7,318,982 B2 | 1/2008 | Gozdz et al. |
| 7,338,620 B2 | 3/2008 | Hsu et al. |
| 7,341,801 B2 | 3/2008 | Reuter et al. |
| 7,351,358 B2 | 4/2008 | Hsu et al. |
| 7,354,532 B2 | 4/2008 | Hsu et al. |
| 7,371,336 B2 | 5/2008 | Hsu et al. |
| 7,390,438 B2 | 6/2008 | Hsu et al. |
| 7,431,866 B2 | 10/2008 | Hsu et al. |
| 7,455,793 B2 | 11/2008 | Hsu et al. |
| 7,462,298 B2 | 12/2008 | Hsu et al. |
| 7,569,158 B2 | 8/2009 | Waller et al. |
| 7,593,004 B2 | 9/2009 | Spath et al. |
| 7,727,421 B2 | 6/2010 | Hsu et al. |
| 7,749,407 B2 | 7/2010 | Hsu et al. |
| 7,837,901 B2 | 11/2010 | Hsu et al. |
| 2001/0019782 A1 | 9/2001 | Igarashi et al. |
| 2001/0038937 A1 | 11/2001 | Suzuki et al. |
| 2002/0009680 A1 | 1/2002 | Majumdar et al. |
| 2002/0017612 A1 | 2/2002 | Yu et al. |
| 2002/0038999 A1 | 4/2002 | Cao |
| 2002/0041151 A1 | 4/2002 | Park |
| 2002/0098377 A1 | 7/2002 | Cao et al. |
| 2002/0099119 A1 | 7/2002 | Craig |
| 2002/0127381 A1 | 9/2002 | Will et al. |
| 2002/0132164 A1 | 9/2002 | Kaneko et al. |
| 2002/0136923 A1 | 9/2002 | Jonas et al. |
| 2002/0190250 A1 | 12/2002 | Grushin et al. |
| 2002/0192476 A1 | 12/2002 | Kambe et al. |
| 2003/0020073 A1 | 1/2003 | Long et al. |
| 2003/0108771 A1 | 6/2003 | Lecloux et al. |
| 2003/0118829 A1 | 6/2003 | Hsu |
| 2003/0146436 A1 | 8/2003 | Parker et al. |
| 2003/0176628 A1 | 9/2003 | Groenendaal |
| 2003/0213952 A1 | 11/2003 | Iechi et al. |
| 2004/0009346 A1 | 1/2004 | Jang et al. |
| 2004/0010115 A1 | 1/2004 | Sotzing |
| 2004/0036067 A1 | 2/2004 | Andriessen |
| 2004/0072987 A1 | 4/2004 | Groenendaal et al. |
| 2004/0092700 A1 * | 5/2004 | Hsu ................... 528/210 |
| 2004/0097741 A1 | 5/2004 | Groenendaal et al. |
| 2004/0102577 A1 | 5/2004 | Hsu et al. |
| 2004/0124504 A1 | 7/2004 | Hsu |
| 2004/0127637 A1 | 7/2004 | Hsu et al. |
| 2004/0147765 A1 | 7/2004 | Baik et al. |
| 2004/0149952 A1 | 8/2004 | DePenning et al. |
| 2004/0149962 A1 | 8/2004 | Andriessen |
| 2004/0181011 A1 | 9/2004 | Korzhenko et al. |
| 2004/0206942 A1 | 10/2004 | Hsu |
| 2004/0214985 A1 | 10/2004 | Martin et al. |
| 2004/0217877 A1 | 11/2004 | Kokonaski et al. |
| 2004/0222413 A1 | 11/2004 | Hsu et al. |
| 2004/0254297 A1 | 12/2004 | Hsu et al. |
| 2004/0262599 A1 | 12/2004 | Bernds et al. |
| 2005/0070654 A1 | 3/2005 | Hsu |
| 2005/0089679 A1 | 4/2005 | Ittel et al. |
| 2005/0124784 A1 | 6/2005 | Sotzing |
| 2005/0184287 A1 | 8/2005 | Herron et al. |
| 2005/0205860 A1 | 9/2005 | Hsu et al. |
| 2005/0208328 A1 | 9/2005 | Hsu et al. |
| 2005/0209388 A1 | 9/2005 | Hsu et al. |
| 2005/0209392 A1 | 9/2005 | Luo et al. |
| 2005/0222333 A1 | 10/2005 | Hsu |
| 2005/0224765 A1 | 10/2005 | Hsu et al. |
| 2005/0224788 A1 | 10/2005 | Hsu et al. |
| 2005/0272214 A1 | 12/2005 | Chiang et al. |
| 2006/0051401 A1 | 3/2006 | Manohar |
| 2006/0076050 A1 | 4/2006 | Williams et al. |
| 2006/0076557 A1 | 4/2006 | Waller et al. |
| 2006/0076577 A1 | 4/2006 | Boos et al. |
| 2006/0113510 A1 | 6/2006 | Luo et al. |
| 2006/0180810 A1 | 8/2006 | Lee et al. |
| 2006/0274049 A1 | 12/2006 | Spath et al. |
| 2006/0289843 A1 | 12/2006 | Hsu et al. |
| 2006/0292362 A1 | 12/2006 | Hsu et al. |
| 2007/0045591 A1 | 3/2007 | Hsu et al. |
| 2007/0069184 A1 | 3/2007 | Hsu et al. |
| 2007/0096082 A1 | 5/2007 | Gaynor et al. |
| 2008/0128662 A1 | 6/2008 | Hsu et al. |
| 2008/0135809 A1 | 6/2008 | Hsu |
| 2008/0210910 A1 * | 9/2008 | Hsu et al. ................ 252/500 |
| 2008/0213594 A1 | 9/2008 | Hsu |
| 2008/0248314 A1 | 10/2008 | Hsu et al. |
| 2008/0251768 A1 | 10/2008 | Hsu et al. |
| 2008/0258605 A1 | 10/2008 | Yukinobu |
| 2008/0283800 A1 | 11/2008 | Hsu |
| 2008/0296536 A1 | 12/2008 | Hsu et al. |
| 2009/0008609 A1 | 1/2009 | Yeisley et al. |
| 2009/0072201 A1 | 3/2009 | Hsu et al. |
| 2009/0114884 A1 | 5/2009 | Hsu |
| 2009/0154059 A1 | 6/2009 | Wessling et al. |
| 2009/0318710 A1 | 12/2009 | Brassat et al. |

FOREIGN PATENT DOCUMENTS

| | | |
|---|---|---|
| CN | 1276388 A | 12/2000 |
| CN | 1439029 A | 8/2003 |
| DE | 2029556 A | 12/1971 |
| DE | 3938094 A1 | 5/1991 |
| DE | 4211459 A1 | 7/1993 |
| DE | 4334390 C2 | 4/1995 |
| DE | 10018750 A1 | 1/2001 |
| DE | 102004006583 A1 | 9/2005 |
| DE | 102004010811 A1 | 9/2005 |
| EP | 245987 A2 | 10/1991 |
| EP | 0488321 A1 | 6/1992 |
| EP | 0560721 A2 | 9/1993 |
| EP | 0593111 B1 | 4/1994 |
| EP | 356239 A2 | 2/1995 |
| EP | 517379 A1 | 6/1995 |
| EP | 361322 A2 | 11/1995 |
| EP | 440957 A2 | 3/1996 |
| EP | 0440957 A2 | 3/1996 |
| EP | 817540 A2 | 1/1998 |
| EP | 828184 A1 | 3/1998 |
| EP | 0962943 A1 | 12/1999 |
| EP | 1026152 A1 | 9/2000 |
| EP | 1054414 A1 | 11/2000 |
| EP | 1079397 A1 | 2/2001 |
| EP | 761691 A2 | 1/2002 |
| EP | 1227529 A2 | 7/2002 |
| EP | 1227529 B1 | 7/2002 |
| EP | 1231251 A1 | 8/2002 |
| EP | 1286569 A1 | 2/2003 |
| EP | 1061530 B1 | 3/2003 |
| EP | 1371709 A1 | 12/2003 |
| EP | 1384739 A1 | 1/2004 |
| EP | 1408563 A2 | 4/2004 |
| EP | 949283 A1 | 4/2005 |
| EP | 949308 A1 | 4/2005 |
| EP | 1546237 A2 | 6/2005 |

| | | | | | | |
|---|---|---|---|---|---|---|
| EP | 1564250 | A1 | 8/2005 | WO | 9614343 A1 | 5/1996 |
| EP | 1564251 | A1 | 8/2005 | WO | 9801909 A1 | 1/1998 |
| EP | 1615971 | A2 | 1/2006 | WO | 9831716 A1 | 7/1998 |
| EP | 1726051 | A1 | 11/2006 | WO | 99/34371 A1 | 7/1999 |
| EP | 1730212 | A1 | 12/2006 | WO | 9952954 A1 | 10/1999 |
| EP | 1191614 | B1 | 6/2009 | WO | 0070655 A2 | 11/2000 |
| EP | 1191612 | B1 | 9/2009 | WO | 01/38219 A1 | 5/2001 |
| FR | 2632979 | | 12/1989 | WO | 0141230 A1 | 6/2001 |
| GB | 2124635 | A | 2/1984 | WO | 0141512 A1 | 6/2001 |
| JP | 62119237 | A | 5/1987 | WO | 01/99207 A2 | 12/2001 |
| JP | 62138582 | A | 6/1987 | WO | 02/02714 A1 | 1/2002 |
| JP | 62164717 | A | 7/1987 | WO | 0200759 A1 | 1/2002 |
| JP | 63135453 | A | 6/1988 | WO | 0205354 A1 | 1/2002 |
| JP | 63215772 | A | 9/1988 | WO | 02/15645 A1 | 2/2002 |
| JP | 02160823 | A | 6/1990 | WO | 0242352 A2 | 5/2002 |
| JP | 02209931 | A | 8/1990 | WO | 02065484 A1 | 8/2002 |
| JP | 02249221 | A | 10/1990 | WO | WO02/065484 A1 | 8/2002 |
| JP | 04234453 | A | 8/1992 | WO | 02/080627 A2 | 10/2002 |
| JP | 05129162 | A | 5/1993 | WO | 02079316 A2 | 10/2002 |
| JP | 05255576 | A | 10/1993 | WO | 02/099907 A1 | 12/2002 |
| JP | 05262981 | A | 10/1993 | WO | 03006515 A1 | 1/2003 |
| JP | 06073271 | A | 3/1994 | WO | 03008424 A1 | 1/2003 |
| JP | 06264024 | A | 9/1994 | WO | WO03/006537 A1 | 1/2003 |
| JP | 06306280 | A | 11/1994 | WO | 03/012908 A2 | 2/2003 |
| JP | 06313038 | A | 11/1994 | WO | 03040257 A1 | 5/2003 |
| JP | 07010973 | A | 1/1995 | WO | 03/048228 A1 | 6/2003 |
| JP | 07090060 | A | 4/1995 | WO | 03/050824 A1 | 6/2003 |
| JP | 07157549 | A | 6/1995 | WO | 03046540 A1 | 6/2003 |
| JP | 07165892 | A | 6/1995 | WO | 03063555 A1 | 7/2003 |
| JP | 08048850 | A | 2/1996 | WO | 03/074601 A2 | 9/2003 |
| JP | 08048858 | A | 2/1996 | WO | 03091688 A2 | 11/2003 |
| JP | 09176310 | A | 7/1997 | WO | 2004016710 A1 | 2/2004 |
| JP | 10261418 | A | 9/1998 | WO | 2004/020444 A1 | 3/2004 |
| JP | 10509751 | A | 9/1998 | WO | 2004018544 A1 | 3/2004 |
| JP | 2001106782 | A | 4/1999 | WO | 2004020502 A1 | 3/2004 |
| JP | 11186103 | A | 7/1999 | WO | 2004/029176 A1 | 4/2004 |
| JP | 11353934 | A | 12/1999 | WO | 2004029128 A2 | 4/2004 |
| JP | 2000091081 | A | 3/2000 | WO | 2004029133 A1 | 4/2004 |
| JP | 2000505249 | A | 4/2000 | WO | 2004031192 A1 | 4/2004 |
| JP | 2000336154 | A | 12/2000 | WO | 2004029133 A1 | 8/2004 |
| JP | 2001006878 | A | 1/2001 | WO | 2004/106404 A1 | 9/2004 |
| JP | 2001035276 | A | 2/2001 | WO | 2004094501 A2 | 11/2004 |
| JP | 2001270999 | A | 10/2001 | WO | 2004105150 A1 | 12/2004 |
| JP | 2001325831 | A | 11/2001 | WO | 2004106404 A1 | 12/2004 |
| JP | 2002500408 | A | 1/2002 | WO | 2005003083 A1 | 1/2005 |
| JP | 2002082082 | A | 3/2002 | WO | 2005018012 A1 | 2/2005 |
| JP | 2002246177 | A | 8/2002 | WO | 2005024853 A1 | 3/2005 |
| JP | 2003187983 | A | 7/2003 | WO | 2005041217 A1 | 5/2005 |
| JP | 2003217862 | A | 7/2003 | WO | 2005052027 A1 | 6/2005 |
| JP | 2003261749 | A | 9/2003 | WO | 2005080525 A2 | 9/2005 |
| JP | 2003264083 | A | 9/2003 | WO | 2005090435 A1 | 9/2005 |
| JP | 2003297582 | A | 10/2003 | WO | 2005090436 A1 | 9/2005 |
| JP | 2003301116 | A | 10/2003 | WO | 2005093872 A1 | 10/2005 |
| JP | 2004500449 | T | 1/2004 | WO | 2005121217 A1 | 12/2005 |
| JP | 2004502004 | A | 1/2004 | WO | 2006073968 A2 | 7/2006 |
| JP | 2004082395 | A | 3/2004 | WO | 2006078264 A2 | 7/2006 |
| JP | 2004107552 | A | 4/2004 | WO | 2007002681 A1 | 1/2007 |
| JP | 2004231939 | A | 8/2004 | WO | 2007002740 A2 | 1/2007 |
| JP | 2004523623 | A | 8/2004 | WO | 2007092296 A2 | 8/2007 |
| JP | 2004532307 | A | 10/2004 | WO | 2007120143 A1 | 10/2007 |
| JP | 2005500196 | T | 1/2005 | | | |
| JP | 2005108504 | A | 4/2005 | | | |
| JP | 2005120363 | A | 5/2005 | | | |
| JP | 2005232452 | A | 9/2005 | | | |
| JP | 2005536595 | A | 12/2005 | | | |
| JP | 2005537348 | A | 12/2005 | | | |
| JP | 2006500461 | A | 1/2006 | | | |
| JP | 2006500463 | A | 1/2006 | | | |
| JP | 2006502254 | A | 1/2006 | | | |
| JP | 2006108064 | A | 4/2006 | | | |
| JP | 2006527277 | A | 11/2006 | | | |
| JP | 2007502531 | A | 2/2007 | | | |
| JP | 2007529607 | A | 10/2007 | | | |
| JP | 2009270117 | A | 11/2009 | | | |
| KR | 200023089 | | 4/2000 | | | |
| RU | 2035803 | C1 | 5/1995 | | | |
| TW | 463524 | B | 11/2001 | | | |
| TW | 505927 | B | 10/2002 | | | |
| TW | I327152 | | 7/2010 | | | |

OTHER PUBLICATIONS

International Search Report, European Patent Office, Rijswijk NL, in PCT/US03/30512, Counterpart to present U.S. Appl. No. 12/275,413, R. Kiebooms, Authorized Officer, Feb. 19, 2004.

BAYTRON Coating Guide Issue Oct. 2002—Obtained From WWW. HCSTARCK-ECHEMICALS.COM.

BAYTRON P VAP Al 4083 and BAYTRON P VP CH 8000 Product Information for Electronic Grades Designed for Use As Hole-Injection Material in OLEDS—Obtained From WWW.HCSTARCK-ECHEMICALS.COM.

BAYTRON Product info from baytron.com; 20070801.

Colvin et al—Light-Emitting Diodes Made From Cadmium Selenide Nanocrystals and a Semiconducting Polymer, Nature, 1994, vol. 370 pp. 354-357.

Conductive Polymer From Wikipedia, The Free Encyclopedia.

Database CA [Online] Chemical Abstracts Service, Columbus, Ohio, US; Takei, Masashi et al: Metal colloid solution, electric conductor ink, electric conductor coating, and undercoating film for forming electric conductor coating layer, retrieved from STN Database accession No. 2001:847689.
Database CA [Online] Chemical Abstracts Service, Columbus, Ohio, US; Wakita, Katsuya et al: "High performance odor sensors and mthod for their manufacture," retrieved from STN Database accession No. 2002:219874.
Extended European Search Report; Application No. EP 10011570.8; 20110517.
Gao, J. et al., Soluble polypyrrole as the transparent anode in polymer light-emitting diodes, Synthetic Metals, 1996, 221-223, 82, Elsevier Science S.A.
Hong et al, "Association of Nafion with Polypyrrole Nanoparticles in a Hydrophilic Polymer Network: Effects on Proton Transport," Journal of Colloid and Interface Science, vol. 218 pp. 233-242; 19991001.
HSU Novel Preparation and Properties of Conductive Polyaniline/Nafion Film, Synthetic Metals, 1991, 41-43, pp. 671-674.
Lefebvre et al—Chemical Synthesis, Characterization, and Electrochemical Studies of Poly(3,4-ethylenedioxythiophen)/Poly(styrene-4-sulfonate) Composites, Chem Mater, 1999, vol. 11 pp. 262-268.
Levi et al—Polymer and Cathode Emission Studies of Polymer-Based Light-Emitting Diodes Under Strong Electrial Pulse Excitation, Journal of Applied Physics, 2000 vol. 88 No. 5 pp. 2548-2552.
Lim et al—Degradation of Organic Light-Emitting Devices Due to Formation and Growth of Dark Spots, Materials Science and Engineering 2001, pp. 154-159.
Extended European Search Report; Application No. EP 10005557.3; 20101201.
Opposition Against EP 1 546 237 B1, H. C. Starck Clevios GmbH, Goslar, Germany, May 13, 2009 (English Translation).
Opposition Against EP 1 546 237 B1, H. C. Starck Clevios GmbH, Goslar, Germany, May 13, 2009 (German Original).
Opposition Against EP 1 615 971 B1, H. C. Starck Clevios GmbH, Goslar, Germany, Mar. 2, 2010 (English Translation).
Opposition Against EP 1 615 971 B1, H. C. Starck Clevios GmbH, Goslar, Germany, Mar. 2, 2010 (German Original).
Pickup—Electronically Conducting cation-exchange Polymer Powders: Synthesis, Characterization and Applications in PEM Fuel Cells and Supercapacitors, Journal of New Materials, 3, 2000, pp. 21-26.
Qi et al—Size Control of Polypyrrole Particles, Chem Mater., 1997, 9, pp. 2934-2939.
Römpp Chemistry Dictionary, Falbe, 9th Edition, 1993.
Schroedner et al—Organische Feldeffekttransistoren Auf Basis Halbleitender Polymere/Organic Field-Effect Transistors Based on Semiconducting Polymers. Elektrotechnik Und Informationstechnik, Springer Verlag. 2003 vol. 120 No. 6, pp. 205-209.
Sharpe et al—Improved Cationic Conductive Polymer, Calgon Corp, Coating Conference (Proceeding) 1981 pp. 83-87.
Simpson et al.—Advances and Applications of Inherently Conductive Polymer Technologies Based on Poly(3,4-Ethylenedioxythiophene) 2005 AIMCAL Fall Technical Conference.
Sun, Zaicheng et al, Catalytic Oxidation Polymerization of Aniline in an H202-Fe2+ System, Journal Applied Polymer Science, vol. 72, pp. 1077-1084, 19990000.
Thelakkat et al—Poly(Triarylamine)S-Synthesis and Application in Electroluminescent Devices and Photovoltaics, Synthetic Metals, 1999, vol. 102 pp. 1125-1128.
Nafion Definition; Wikipedia; 20100218.
PCT International Search Report for International Application No. PCT/US2003/030026; R. Kiebooms Authorized Officer Mar. 24, 2004.
PCT International Search Report for International Application No. PCT/US2005/008763; F. Rousseau Authorized Officer Aug. 3, 2005.
PCT International Search Report for International Application No. PCT/US2003/030509; C. Meiners Authorized Officer Feb. 17, 2004.
PCT International Search Report for International Application No. PCT/US2005/008561; G. Wolfbauer Authorized Officer Jun. 30, 2005.
PCT International Search Report for International Application No. PCT/US2005/008563; R. Kiebooms Authorized Officer Jun. 17, 2005.
Campbell, I.H. et al., "Excitation Transfer Processes in a Phosphor-Doped Poly 9p-phenylene vinylene) Light-Emitting Diode," Physical Review B., vol. 65, 085210-1-085210-8.
Caras-Quintero et al., "Efficient Synthesis of 3,4-ethylenedioxythiophenes by Mitsunobu Reaction" Chemical Communications, Chemcom, Royal Society of Chemistry, GB, vol. 22, Nov. 4, 2002, pp. 2690-2691.
Caras-Quintero et al., "Synthesis of the First Enantiomerically Pure and Chiral, Disubstituted 3,4-ethylenedioxythiophenes (EDOTs) and Corresponding Stereo- and Regioregular PEDOTs," Chemical Communication, 2004, pp. 926-927.
Cassel et al., "Original Synthesis of Linear, Branched and Cyclic Oligoglycerol Standards," European Journal of Organic Chemistry, 2001, No. 5, pp. 875-896.
Cen et al., 1,1,2,2-Tetrafluoro-2-(polyfluoroalkoxy)ethanesulfonic Acids, 1,1,2,2-Tetrafluoro-2-(perfluoroalkoxy) ethanesulfonic Acids, and 2,2'-Oxybis(1,1,2,2-tetrafluoroethanesulfonic acid), Inorganic Chemistry, 1988, vol. 27, pp. 1376-1377, American Chemical Society.
Desmarteau, Novel Perfluoinated Ionomers and Ionenes, Journal of Fluorine Chemistry, 1995, vol. 72, pp. 203-208.
Downs C et al: "Efficient Polymerization of Aniline at Carbon Nanotube Electrodes", Advanced Materials, vol. 11, No. 12, Jan. 1, 1999, pp. 1028-1031.
England et al; "Nucleophilic Reactions of Fluoro-olefins," Journal of American Chemical Society (1960) v. 82, p. 5116.
Feiring et al., "Aromatic Monomers with Pendant Fluoroalkylsulfonate and Sulfonimide Groups," Journal of Fluorine Chemistry, 2000, vol. 105, pp. 129-135.
Feiring et al., "Novel Aromatic Polymers with Pendant Lithium Perfluoroalkylsulfonate or Sulfinimide Groups," Macromolecules, 2000, vol. 33, pp. 9262-9271.
Fowler J D et al: "Hydrogen detection by Polyaniline nanofibers on gold and platinum electrodes", The Journal of Physical Chemistry C, vol. 113, No. 16, Sep. 4, 2001, pp. 6444-6449.
Gustafsson et al., "Flexible Light-Emitting Diodes Made from Soluble Conducting Polymers," Nature, 1992, vol. 357, pp. 477-479.
Hirai et al; "Electrochemical Behaviors of Polypyrrole, Poly-3-Methyl-thiophene, and Polyaniline Deposited on Nafion-Coated Electrodes," Journal of the Electrochemical Society, vol. 135, No. 5, May 1, 1988, pp. 1132-1137, Electrochemical Society, Manchester, NH.
Huang et al., "Well-Dispersed Single-Walled Carbon Nanotube/Polyaniline Composite Films," Carbon, vol. 41, 2003, pp. 2731-2736.
Iijima et al.—Single-Shell Carbon Nanotubes of 1-nm Diameter, Nature, 1993 vol. 363 pp. 603-605.
Ivanov et al, The Study of Carbon Nanotubules Produced by Catalytic Method, Chem. Phys. Lett. 1994, vol. 223 pp. 329-335.
Journet et al.,—Large-Scale Production of Single-Walled Carbon Nanotubes by the Electric-Arc Technique, Nature, 1997 vol. 388 pp. 756-758.
Kim et al, Enhancement of Electrical Conductivity of Poly(3,4-ethylenedioxythiophene)/Poly(4-styrenesulfonate) by a Change of Solvents, Synthetic Metals, Elsevier Sequoia, vol. 126, No. 2/3, pp. 311-316, Feb. 2002.
Kitani et al; "Properties of Elastic Polyaniline," Synthetic Metals, vol. 84, No. 1-3, 1997, pp. 83-84, Elsevier Science S. A.
Laha, S.C. et al., "Highly Selective Epoxidation of Olefinic Compounds Over TS-1 and TS-2 Redox Molecular Sieves using Anhydrous Urea-Hydrogen Peroxide as Oxidizing Agent," Journal of Catalysis, 2002, 208(2), 339-344.
Lee et al., Poly(thieno(3,4-b)thiophene) A New Stable Low Band Gap Conducting Polymer, Macromolecules, 2001, vol. 34, pp. 5746-5747.
Li et al—Large-Scale Synthesis of Aligned Carbon Nanotubes, Science, 1996 vol. 274 pp. 1701-1703.
Lima, A., "Electropolymerization of and 3,4-ethylenedioxtyiophene and 3,4-Ethylenedioxythiophene Methanol in the Persence of Dodecylbenezenesulfonate," Synthetic Metals, 1998, 93, 33-41.

Madler et al—Visibly Transparent and Radiopaque Inorganic Organic Composites From Flange-Made Mixed-Oxide Fillers. Journal of Nanoparticle Research, vol. 8, No. 3-4, 2005, p. 323-333.
Morrison & Boyd, Organic Chemistry, 6th Ed., 1994, pp. 312-317 (First Half).
Moeller et al., "A Polymer/Semiconductor Write-Once Read-Many-Times Memory," Nature, 2003, vol. 426, pp. 166-169.
O'Brien, D.F. et al., "Electrophosphorescence From a Doped Polymer Light Emitting Diode," Synthetic Metals, 2001, 116(1-3), 379-383.
Riedel et al., Tailored Highly Transparent Composite Hole-Injection Layer Consisting of Petot: PSS and SiO2 Nanoparticles for Efficient Polymer Light-Emitting Diodes, Advanced Materials, 2011 vol. 23 pp. 740-745.
Schottland P. et al., "Synthesis and Polymerization of New Monomers Derived From 3, 4-Ethylenedioxythiophene" Journal De Chimie Physique, Societe De Chimie Physique, Paris, Fr. vol. 95, No. 6, Jan. 1, 1998, pp. 1258-1261.
Segura, J.L., et al., "Synthesis and Electropolymerization of a Perylenebisimide-Functionalized 3, 4-Ethylenedioxythiophene Derivative," Organic Letters, vol. 7, No. 12, 2005, pp. 2345-2348.
Sotzing et al., "Poly(thieno(3,4-b)thiophene): A p- and n-Dopable Polythiophene Exhibiting High Optical Transparency in the Semi-conducting State," Macromolecules, 2002, vol. 35, pp. 7281-7286.
Stejskal et al., "Polyaniline Dispersions 10. Coloured Microparticles of Variable Density Prepared Using Stabilizer Mixtures," Colloid Polymer Science, vol. 278, 2000, pp. 654-658.
Tang et al., "Organic/Inorganic Material for Coating on Metals," Materials Research Society Symp. Proc., vol. 734, 2003, pp. B.9.57.1-B.9.57.7.
Thess et al., Crystalline Ropes of Metallic Carbon Nanotubes, Science, 1996 vol. 273 pp. 483-487.
Unknown, The Experimental Chemistry Course, 4th Ed., vol. 20, Organic Synthesis II—Alcohol and Amines, 1992, pp. 49-51 (Japanese Only).
Venturello, C. et al., "A Convenient Catalytic Method for the Dihydroxylation of Alkenes by Hydrogen Peroxide," Synthesis, 1989, 4, 295-297.
Wang—Photoconductive Materials, Kirk-Othmer Encyclopedia of Chemical Technology, Fourth Edition, 1996, vol. 18 pp. 837-860.
Wu et al., "Transparent, Conductive Carbon Nanotube Films," Science, 2004, vol. 305, pp. 1273-1276.
Yang S-M et al: "The photoelectrochemical properties of TiO2 electrodes modified by quantum sized PbS and thiols", Synthetic Metals, vol. 123, No. 2, Sep. 4, 2001, pp. 267-272.
Yuan Y F et al: "Size and morphology effects of ZnO anode nanomaterials for Zn/Ni secondary batteries; Size and morphology effects of ZnO anode nanomaterials for Zn/Ni secondary batteries", Nanotechnology, vol. 16, No. 6, Jun. 1, 2005, pp. 803-808.
Opposition Against EP 1726051, Opposition Document from Herzog Fiesser & Partner; Heraeus Precious Metals GmbH; Sep. 15, 2011 [German].
Opposition Against EP 1726051, Opposition Document from Herzog Fiesser & Partner; Heraeus Precious Metals GmbH; Sep. 15, 2011 [English Translation].
Schwendeman et al., "Perfluoroalkanoate-substituted PEDOT for Electronic Device Applications," Advanced Functional Materials, vol. 13, No. 7, 2003, pp. 541-547.
Observations of the Patentee [regarding the Opposition to EP 1026051]; May 31, 2012.
Opposition Against EP 1720651: Experimental Data: PEDOT; May 31, 2012 [E6].
Aleshin et al., "Transport Properties of Poly(3,4-ethylenedioxythiophene)/poly(styrenesulfonate)," Synthetic Metals, 1998, vol. 94, pp. 173-177 [E7].
Bharathan et al., "Polymer/metal Interfaces and the Performance of Polymer Light-Emitting Diodes," Journal of Applied Physics, 1998, vol. 84(6), pp. 3207-3211 [E8].
Opposition Against EP 1726051; Main Request—Claims; 20120531.
Opposition Against EP 1726051; First Auxiliary Request—Claims; 20120531.
Opposition Against EP 1726051; Second Auxiliary Request—Claims; 20120531.
Opposition Against EP 1726051; Third Auxiliary Request—Claims; 20120531.
Opposition Against EP 1726051; Fourth Auxiliary Request—Claims; 20120531.
Opposition Against EP 1726051; Fifth Auxiliary Request—Claims; Sep. 15, 2011.
Opposition Against EP 1726051; Sixth Auxiliary Request—Claims; 20120531.
Opposition Against EP 1726051; Seventh Auxiliary Request—Claims; 20120531.
Opposition Against EP 1726051; Eighth Auxiliary Request—Claims; 20120531.
Opposition Against EP 1726051; Ninth Auxiliary Request—Claims; 20120531.
Opposition Against EP 1726051; Tenth Auxiliary Request—Claims; 20120531.
Opposition Against EP 1726051; Eleventh Auxiliary Request—Claims; 20120531.
Opposition Against EP 1726051: Experimental Data: Polypyrrole/Nafion; 20120702 [E9].
Opposition Against EP 1 546 237 B1: Letter from Opponent, H.C. Starck Clevios GmbH, May 13, 2009 (German Original).
Opposition Against EP 1 546 237 B1: Letter from Opponent, H.C. Starck Clevios GmbH, May 13, 2009 (English Translation).
Pickup, Peter G. et al., Electronically conducting cation-exchange polymer powders: synthesis, characterization and applications in PEM fuel cells and supercapacitors, Journal of New Materials for Electrochemical Systems, vol. 3, 2000, pp. 21-26.
"Nafion," Wikipedia extract, May 13, 2009 (German).
"Nafion," Wikipedia extract, Feb. 18, 2010 (English).
Opposition Against EP 1 546 237 B1, E. I. du Pont de Nemours and Company, Wilmington, Delaware, Observations of the Patent Proprietor, Mar. 1, 2010.
"DuPont Fuel Cells-DuPont Nafion PFSA Membranes NE-1135, N-115, N-117, NE-1110," Jan. 1, 2005, pp. 1-4.
Opposition Against EP 1 546 237 B1, E. I. du Pont de Nemours and Company, Wilmington, Delaware, Observations of the Patent Proprietor, Mar. 1, 2010, Annex, Experimental Data, Sep. 21-Oct. 6, 2009.
Opposition Against EP 1 546 237 B1, E. I. du Pont de Nemours and Company, Wilmington, Delaware, Observations of the Patent Proprietor, Mar. 1, 2010, Annex, Declaration of Dr Hjalti Skulason dated Feb. 24, 2010.
Lefebvre, Mark et al., Chemical Synthesis, Characterization, and Electrochemical Studies of Poly(3,4- ethylenedioxythiophene)/Poly(styrene-4-sulfonate) Composites, Chem. Mater., 1999, 262-268, 11, American Chemical Society.
Qi, Zhigang et al., Size Control of Polypyrrole Particles, Chem. Mater., American Chemical Society,1997, vol. 9, pp. 2934-2939.
Jiang et al., "Preparation of a Nafion Composite Membrane using a Porous Teflon Support," Journal of Membrane Science, Elsevier Scientific Publ. Co., Amsterdam, NL, vol. 132, No. 2, Sep. 3, 1997, pp. 273-276.
Opposition Against EP 1 546 237; Decision Revoking European Patent; EPO Opposition Division; Dec. 8, 2011.
Decision 19931229; Case No. T0860/93; Application No. 88115147.6.
Decision 19971120; Case No. T1078/93-3.3.5; Application No. 90905154.2; Publication No. 0462216; Process for Improving the Physical and Catalytic Properties of a Fluid Cracking.
Decision 20020117; Case No. T0939/98-3.3.3; Application No. 95910871.3; Publication No. 0742800; Two-phase Acidic Aqueous Compositions for Diffusion Transfer Products.
Decision 20080729; Case No. T0114/06-3.3.02; Application No. 04013422.3; Publication No. 1452171; Pharmaceutical Liquid Suspensions.
Hackley et al., The Use of Nomenclature in Dispersion Science and Technology, NIST, Aug. 2001, pp. 2-4, 10, 11.
Lewis, Hawley's Condensed Chemical Dictionary, 12th Ed., 1993, pp. 300-301.
Aldrich Catalog, Germany; 1994-95; p. 1137; as evidence of product with catalog No. 27,740-4.

PCT International Search Report for PCT/US2002 02/003922, counterpart to U.S. Appl. No. 10/055,669; H. Wengeler, Authorized Officer; EPO; Jul. 15, 2007.

Extended European Search Report for Application No. EP10 01 2649; Rafael Kiebooms, Examiner; Mar. 1, 2011.

EPO Official Action for Application No. 03770524.1; Feb. 25, 2010; R. Kiebooms, Examiner.

EPO Official Action for Application No. 05725618.2; May 31, 2011.

Appleby et al., —Polymeric Perfluoro Bis-Sulfonomides as Possible Fuel Cell Electrolytes, Journal of the Electrochemical Society, 1993, vol. 140 pp. 109-111.

Arnautov et al., New Dopant-Solvent System for Conductive PAN Films Production, Synthetic Metals, 1997, vol. 84, No. 1-3, pp. 133-134, Elsevier Science S.A.

Baytron H. C. Stark GmbH (Brochure).

Brown et al, "Built-in field electroabsorbtion spectroscopy of plymer light-emitting diodes incorporating a doped poly (3,4-ethylene dioxythiophene) hole injection layer," Applied Physics Letters, AIP, American Institute of Physics, vol. 75, No. 12, Sep. 20, 1999, pp. 1679-1681.

* cited by examiner

WATER DISPERSIBLE POLYANILINES MADE WITH POLYMERIC ACID COLLOIDS FOR ELECTRONICS APPLICATIONS

CROSS REFERENCE TO RELATED APPLICATIONS

This application is a division of U.S. application Ser. No. 10/669,577 filed on Sep. 24, 2003, now allowed, which claims priority under 35 U.S.C. §119(e) from Provisional Application No. 60/413,203, which is incorporated by reference herein in its entirety.

FIELD OF THE INVENTION

The invention relates to aqueous dispersions of electrically conducting polymers of aniline, wherein the electrically conducting polymer is synthesized in the presence of polymeric acid colloids.

BACKGROUND OF THE INVENTION

Electrically conducting polymers have been used in a variety of organic electronic devices, including in the development of electroluminescent (EL) devices for use in light emissive displays. With respect to EL devices, such as organic light emitting diodes (OLEDs) containing conducting polymers, such devices generally have the following configuration:

anode/buffer layer/EL polymer/cathode

The anode is typically any material that has the ability to inject holes into the otherwise filled π-band of the semiconducting, EL polymer, such as, for example, indium/tin oxide (ITO). The anode is optionally supported on a glass or plastic substrate. The EL polymer is typically a conjugated semiconducting polymer such as poly(paraphenylenevinylene) or polyfluorene. The cathode is typically any material (such as, e.g., Ca or Ba) that has the ability to inject electrons into the otherwise empty π*-band of the semiconducting, EL polymer.

The buffer layer is typically a conducting polymer and facilitates the injection of holes from the anode into the EL polymer layer. The buffer layer can also be called a hole-injection layer, a hole transport layer, or may be characterized as part of a bilayer anode. Typical conducting polymers employed as buffer layers include polyaniline (PANI) and polydioxythiophenes such as poly(3,4-ethylenedioxythiophene) (PEDT). These materials can be prepared by polymerizing the corresponding monomers in aqueous solution in the presence of a water soluble polymeric acid, such as poly(styrenesulfonic acid) (PSS).

The aqueous electrically conductive polymer dispersions synthesized with water soluble polymeric sulfonic acids have undesirable low pH levels. The low pH can contribute to decreased stress life of an EL device containing such a buffer layer, and contribute to corrosion within the device. Accordingly, there is a need for compositions and buffer layers prepared therefrom having improved properties.

Electrically conducting polyanilines are typically prepared by polymerizing aniline or substituted aniline monomers in aqueous solution by an oxidative polymerization using an oxidizing agent such as ammonium persulfate (APS), sodium persulfate or potassium persulfate. The aqueous solution contains a water soluble polymeric acid such as poly(2-acrylamido-2-methyl-1-propanesulfonic acid) ("PAAMPSA"), PSS, and the like. In general, enough of the acid is present to form acid/base salts with emeraldine base of polyanilines, wherein formation of the acid/base salt renders the polyanilines electrically conductive. Thus, for example, emeraldine base of polyaniline (PANI) is typically formed with PAAMPSA to resulting in electrically conductive PANI/PAAMPSA.

Aqueous polyaniline dispersions are commercially available from Ormecon Chemie GmbH and Co. KG (Ammersbeck, Germany). It is known as D1005 W LED. The polyaniline is made from aniline and water soluble poly(styrenesulfonic acid). The dried films obtained from D1005 W LED re-disperse readily in water. The water becomes acidic with pH in the range of 1 at 2.5% (w/w). Films gain about 24.0% (w/w) moisture at ambient conditions.

Dried films from a lab batch aqueous dispersion of polyaniline/poly(2-acrylamido-2-methyl-1-propanesulfonic acid), are also readily re-dispersible in water. The polyaniline is made from aniline and a water soluble PAAMPSA.

Electrically conducting polymers also have utility as electrodes for electronic devices, such as thin film field effect transistors. In such transistors, an organic semiconducting film is present between source and drain electrodes. To be useful for the electrode application, the conducting polymers and the liquids for dispersing or dissolving the conducting polymers have to be compatible with the semiconducting polymers and the solvents for the semiconducting polymers to avoid re-dissolution of either conducting polymers or semiconducting polymers. The electrical conductivity of the electrodes fabricated from the conducting polymers should be greater than 10 S/cm (where S is a reciprocal ohm). However, the electrically conducting polyaniline made with a polymeric acid typically provide conductivity in the range of ~$10^{-3}$ S/cm or lower. In order to enhance conductivity, conductive additives may be added to the polymer. However, the presence of such additives can deleteriously affect the processability of the electrically conducting polyaniline. Accordingly, there is a need for improved conductive polyaniline with good processability and increased conductivity.

SUMMARY OF THE INVENTION

In one embodiment of the invention, compositions are provided comprising aqueous dispersions of polyaniline and at least one colloid-forming polymeric acids. The invention compositions are useful as buffer layers in a variety of organic electronic devices, such as organic light emitting diodes (OLEDs). Invention compositions are also useful in combination with conductive fillers, such as metal nanowires or carbon nanotubes, in applications such as drain, source, or gate electrodes in thin film field effect transistors.

In accordance with another embodiment of the invention, there are provided organic electronic devices, including electroluminescent devices, comprising buffer layers of the invention compositions that are cast.

In accordance with still another embodiment of the invention, there are provided methods for synthesizing aqueous dispersions of polyaniline and at least one colloid-forming polymeric acid.

DETAILED DESCRIPTION OF THE INVENTION

Figure 1:
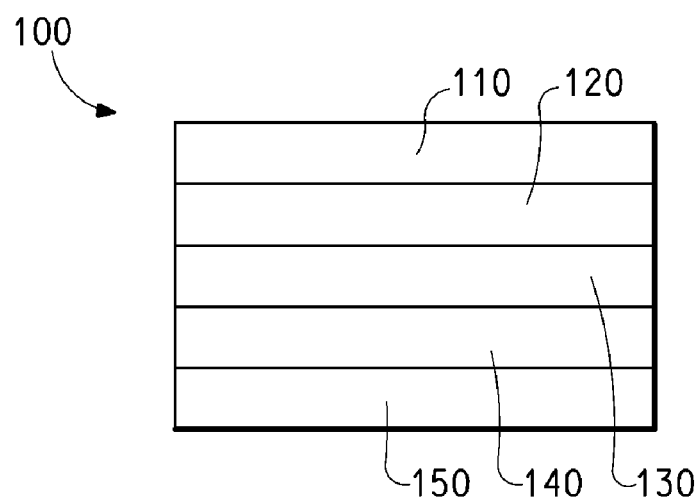
FIG. 1 illustrates a cross-sectional view of an electronic device that includes a buffer layer according to the invention.

In one embodiment of the invention, compositions are provided comprising aqueous dispersions of polyaniline and colloid-forming polymeric acids. As used herein, the term "dispersion" refers to a continuous liquid medium containing a suspension of minute particles. In accordance with the invention, the "continuous medium" is typically an aqueous liquid, e.g., water. As used herein, the term "aqueous" refers to a liquid that is at least about 40% by weight water. As used herein, the term "colloid" refers to the minute particles suspended in the continuous medium, said particles having a nanometer-scale particle size. As used herein, the term "colloid-forming" refers to substances that form minute particles when dispersed in aqueous solution, i.e., "colloid-forming" polymeric acids are not water-soluble.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

It has been discovered that aqueous dispersions of electrically conductive poly(anilines) can be prepared when aniline monomers are polymerized chemically in the presence of colloid-forming polymeric acids. Further, it has been discovered that use of a polymeric acid that is not water soluble in preparation of an aqueous dispersion of the poly(anilines) yields a composition with superior electrical properties. One advantage of these aqueous dispersions is that the electrically conductive minute particles are stable in the aqueous medium without forming a separate phase over a long period of time before a use. Moreover, they generally do not re-disperse once dried into films.

Compositions according to the invention contain a continuous aqueous phase in which the polyaniline and colloid-forming polymeric acid are dispersed. Polyaniline contemplated for use in the practice of the present invention is derived from aniline monomers having Formula I below.

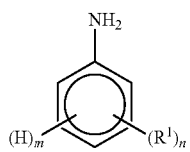

(I)

where in Formula I:
n is an integer from 0 to 4;
m is an integer from 1 to 5, with the proviso that n+m=5; and
$R^1$ is independently selected so as to be the same or different at each occurrence and is selected from alkyl, alkenyl, alkoxy, cycloalkyl, cycloalkenyl, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

The polymerized material comprises aniline monomer units, each of the aniline monomer units having a formula selected from Formula II below and Formula III.

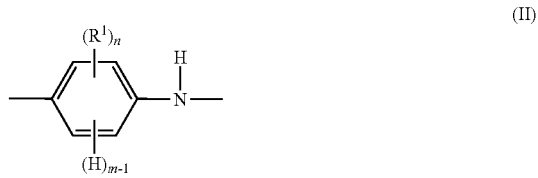

(II)

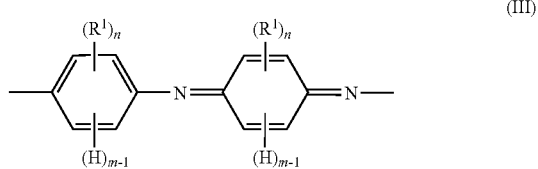

(III)

where n, m, and $R^1$ are as defined above.

Colloid-forming polymeric acids contemplated for use in the practice of the invention are insoluble in water, and form colloids when dispersed into an aqueous medium. The polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any polymeric acid that is colloid-forming when dispersed in water is suitable for use in the practice of the invention. In one embodiment, the colloid-forming polymeric acid is polymeric sulfonic acid. Other acceptable polymeric acids include polymeric phosphoric acids, polymeric carboxylic acids, polymeric acrylic acids, and mixtures thereof, including mixtures having polymeric sulfonic acids. In another embodiment, the polymeric sulfonic acid is fluorinated. In still another embodiment, the colloid-forming polymeric sulfonic acid is perfluorinated. In yet another embodiment, the colloid-forming polymeric sulfonic acid is a perfluoroalkylenesulfonic acid.

In still another embodiment, the colloid-forming polymeric acid is a highly-fluorinated sulfonic acid polymer ("FSA polymer"). "Highly fluorinated" means that at least about 50% of the total number of halogen and hydrogen atoms in the polymer are fluorine atoms, and it one embodiment at least about 75%, and in another embodiment at least about 90%. In another embodiment, the polymer is perfluorinated. The term "sulfonate functional group" refers to either to sulfonic acid groups or salts of sulfonic acid groups, and in one embodiment alkali metal or ammonium salts. The functional group is represented by the formula —$SO_3X$ where X is a cation, also known as a "counterion". X may be H, Li, Na, K or $N(R_1)(R_2)(R_3)(R_4)$, and $R_1$, $R_2$, $R_3$, and $R_4$ are the same or different and are in one embodiment H, $CH_3$ or $C_2H_5$. In one embodiment, X is H, in which case the polymer is said to be in the "acid form". X may also be multivalent, as represented by such ions as $Ca^{++}$, and $Al^{+++}$. It is clear to the skilled artisan that in the case of multivalent counterions, represented generally as M$^{n+}$, the number of sulfonate functional groups per counterion will be equal to the valence "n".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group (—SO$_2$F), which can be subsequently hydrolyzed to a sulfonate functional group. For example, copolymers of a first fluorinated vinyl monomer together with a second fluorinated vinyl monomer having a sulfonyl fluoride group (—SO$_2$F) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

Possible second monomers include fluorinated vinyl ethers with sulfonate functional groups or precursor groups which can provide the desired side chain in the polymer. Additional monomers, including ethylene, propylene, and R—CH═CH$_2$ where R is a perfluorinated alkyl group of 1 to 10 carbon atoms, can be incorporated into these polymers if desired. The polymers may be of the type referred to herein as random copolymers, that is copolymers made by polymerization in which the relative concentrations of the comonomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, the FSA polymers for use in the present invention include a highly fluorinated, including those that are perfluorinated, carbon backbone and side chains represented by the formula $$-(O-CF_2CFR_f)_a-O-CF_2CFR'_fSO_3X$$

wherein Rf and R'f are independently selected from F, Cl or a perfluorinated alkyl group having 1 to 10 carbon atoms, a=0, 1 or 2, and X is H, Li, Na, K or N(R1)(R2)(R3)(R4) and R1, R2, R3, and R4 are the same or different and in one embodiment are H, CH$_3$ or C$_2$H$_5$. In another embodiment X is H. As stated above, X may also be multivalent.

The preferred FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

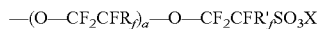
$$-O-CF_2CF(CF_3)-O-CF_2CF_2SO_3X$$

where X is as defined above. FSA polymers of this type are disclosed in U.S. Pat. No. 3,282,875 and can be made by copolymerization of tetrafluoroethylene (TFE) and the perfluorinated vinyl ether CF$_2$═CF—O—CF$_2$CF(CF$_3$)—O—CF$_2$CF$_2$SO$_2$F, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a preferred polymer of the type disclosed in U.S. Pat. Nos. 4,358,545 and 4,940,525 has the side chain —O—CF$_2$CF$_2$SO$_3$X, wherein X is as defined above. This polymer can be made by copolymerization of tetrafluoroethylene (TFE) and the perfluorinated vinyl ether CF$_2$═CF—O—CF$_2$CF$_2$SO$_2$F, perfluoro(3-oxa-4-pentenesulfonyl fluoride) (POPF), followed by hydrolysis and further ion exchange as necessary.

The FSA polymers for use in this invention have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. With most polymers, the IXR is about 3 to about 33, and in one embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—CF$_2$—CF(CF$_3$)—O—CF$_2$—CF$_2$—SO$_3$H (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain 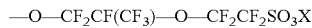—O—CF$_2$CF$_2$SO$_3$H (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, but are not limited to, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 disclose methods for making of aqueous alcoholic dispersions. After the dispersion is made, concentration and the dispersing liquid compositions composition can be adjusted by methods known in the art.

Aqueous dispersions of the FSA polymers have particle sizes as small as possible and an EW as small as possible, so long as a stable colloid is formed.

Aqueous dispersions of FSA polymer are available commercially as Nafion® dispersions, from E. I. du Pont de Nemours and Company (Wilmington, Del.).

In accordance with the invention, stable aqueous dispersions are prepared by first synthesizing an electrically conducting polyaniline in the presence of an aqueous colloid-forming polymeric acid dispersion, thereby forming an as-synthesized aqueous dispersion comprising the electrically conducting polyanilines and the colloidal polymeric acid. The electrically conducting polyanilines employed in invention methods are typically prepared by oxidatively polymerizing aniline or substituted aniline monomers in an aqueous colloid-forming polymeric acid dispersion in the presence of an oxidizing agent, such as ammonium persulfate (APS), sodium persulfate, potassium persulfate and the like. The aqueous dispersion contain at least enough of a suitable colloid-forming polymeric acid to form base/acid salts with the emeraldine base of polyaniline, wherein formation of the acid/base salt renders the polyanilines electrically conductive.

The method of making an aqueous dispersion of polyaniline and at least one colloid-forming polymeric acid includes forming a reaction mixture by combining water, aniline monomer, colloid-forming polymeric acid, and oxidizer, in any order, provided that at least a portion of the colloid-forming polymeric acid is present when at least one of the aniline monomer and the oxidizer is added.

In one embodiment, the method of making the aqueous dispersion of polyaniline and at least one colloid-forming polymeric acid includes:

(a) providing an aqueous dispersion of a colloid-forming polymeric acid;

(b) adding an oxidizer to the dispersion of step (a); and (c) adding an aniline monomer to the dispersion of step (b).

In another embodiment, the aniline monomer is added to the aqueous dispersion of the colloid-forming polymeric acid prior to adding the oxidizer. Step (b) above, which is adding oxidizing agent, is then carried out.

In another embodiment, a mixture of water and the aniline monomer is formed, in a concentration typically in the range of about 0.5% by weight to about 2.0% by weight aniline. This aniline mixture is added to the aqueous dispersion of the colloid-forming polymeric acid, and steps (b) above which is adding oxidizing agent is carried out.

In another embodiment, the aqueous polymerization dispersion may include a polymerization catalyst, such as ferric sulfate, ferric chloride, and the like. The catalyst is added before the last step. In another embodiment, a catalyst is added together with an oxidizing agent.

In one embodiment, the polymerization is carried out in the presence of co-dispersing liquids which are miscible with water. Examples of suitable co-dispersing liquids include, but are not limited to ethers, alcohols, alcohol ethers, cyclic ethers, ketones, nitriles, sulfoxides, amides, and combinations thereof. In one embodiment, the co-dispersing liquid is an alcohol. In one embodiment, the co-dispersing liquid is an alcohol selected from n-propanol, isopropanol, t-butanol, dimethylacetamide, dimethylformamide, N-methylpyrrolidone, and mixtures thereof. In general, the amount of co-dispersing liquid should be less than about 60% by volume. In one embodiment, the amount of co-dispersing liquid is between 20 and 50% by volume. The use of a co-dispersing liquid in the polymerization significantly reduces particle size and improves filterability of the dispersions. In addition, buffer materials obtained by this process show an increased viscosity and films prepared from these dispersions are of high quality.

The co-dispersing liquid can be added to the reaction mixture at any point in the process prior to the addition of either the oxidizer or the aniline monomer, whichever is added last. In one embodiment, the co-dispersing liquid is added before both the aniline monomer and the colloid-forming polymeric acid, and the oxidizer is added last. In one embodiment the co-dispersing liquid is added prior to the addition of the aniline monomer and the oxidizer is added last.

In one embodiment, the polymerization is carried out in the presence of a co-acid which is a Bronsted acid. The acid can be an inorganic acid, such as HCl, sulfuric acid, and the like, or an organic acid, such as acetic acid. Alternatively, the acid can be a water soluble polymeric acid such as poly(styrenesulfonic acid), poly(2-acrylamido-2-methyl-1-propanesulfonic acid, or the like, or a second colloid-forming acid, as described above. Combinations of acids can be used.

The co-acid can be added to the reaction mixture at any point in the process prior to the addition of either the oxidizer or the aniline monomer, whichever is added last. In one embodiment, the co-acid is added before both the aniline monomer and the colloid-forming polymeric acid, and the oxidizer is added last. In one embodiment the co-acid is added prior to the addition of the aniline monomer, followed by the addition of the colloid-forming polymeric acid, and the oxidizer is added last.

In one embodiment, the polymerization is carried out in the presence of both a co-dispersing liquid and a co-acid. Devices with buffer layers made from polyaniline/Nafion® that was polymerized in the presence of an alcohol co-dispersing agent and a co-acid show high efficiencies, low operating voltages, low leakage currents and long lifetimes.

In the method of making the aqueous dispersion of polyaniline and at least one colloid-forming polymeric acid, the molar ratio of oxidizer to aniline monomer is generally in the range of 0.1 to 2.0; and in one embodiment is 0.4 to 1.5. The molar ratio of colloid-forming polymeric acid to aniline monomer is generally in the range of 0.2 to 5. The overall solid content is generally in the range of about 1.0% to 6% in weight percentage; and in one embodiment of about 2% to 4.5%. The reaction temperature is generally in the range of about 4° C. to 40° C.; in one embodiment about 20° C. to 35° C. The molar ratio of optional co-acid to aniline monomer is about 0.05 to 4. The addition time of the oxidizer influences particle size and viscosity. Thus, the particle size can be reduced by slowing down the addition speed. In parallel, the viscosity is increased by slowing down the addition speed. The reaction time is generally in the range of about 1 to about 30 hours.

As synthesized, the aqueous dispersions of polyaniline and polymeric acid colloids generally have a very low pH. It has been found that the pH can be adjusted to typically be between about 1 to about 8, without adversely affecting the properties in devices. It is frequently desirable to have a pH which is approximately neutral, as the acidity can be corrosive. It has been found that the pH can be adjusted using known techniques, for example, ion exchange or by titration with an aqueous basic solution. Stable dispersions of polyaniline and fluorinated polymeric sulfonic acid colloids with a pH up to 7-8 have been formed. Aqueous dispersions of polyaniline and other colloid-forming polymeric acids can be similarly treated to adjust the pH.

In one embodiment, after completion of the polymerization reaction, the as-synthesized aqueous dispersion is contacted with at least one ion exchange resin under conditions suitable to remove decomposed species, side reaction products, and unreacted monomers, and to adjust pH, thus producing a stable, aqueous dispersion with a desired pH. In one embodiment, the as-synthesized aqueous dispersion is contacted with a first ion exchange resin and a second ion exchange resin, in any order. The as-synthesized aqueous dispersion can be treated with both the first and second ion exchange resins simultaneously, or it can be treated sequentially with one and then the other.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as cation exchangers or anion exchangers. Cation exchangers have positively charged mobile ions available for exchange, typically protons or metal ions such as sodium ions. Anion exchangers have exchangeable ions which are negatively charged, typically hydroxide ions.

In one embodiment, the first ion exchange resin is a cation, acid exchange resin which can be in protonic or metal ion, typically sodium ion, form. The second ion exchange resin is a basic, anion exchange resin. Both acidic, cation including proton exchange resins and basic, anion exchange resins are contemplated for use in the practice of the invention. In one embodiment, the acidic, cation exchange resin is an inorganic acid, cation exchange resin, such as a sulfonic acid cation exchange resin. Sulfonic acid cation exchange resins contemplated for use in the practice of the invention include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphorous cation exchange resin. In addition, mixtures of different cation exchange resins can be used.

In another embodiment, the basic, anionic exchange resin is a tertiary amine anion exchange resin. Tertiary amine anion exchange resins contemplated for use in the practice of the invention include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the as-synthesized aqueous dispersion either simultaneously, or consecutively. For example, in one embodiment both resins are added simultaneously to an as-synthesized aqueous dispersion of an electrically conducting polymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the as-synthesized aqueous dispersion. Moreover, the basic, anion exchange and/or acidic, cation exchange resins renders the acidic sites more basic, resulting in increased pH of the dispersion. In general, about one to five grams of ion exchange resin is used per gram of polyaniline/polymeric acid colloid.

In many cases, the basic ion exchange resin can be used to adjust the pH to the desired level. In some cases, the pH can be further adjusted with an aqueous basic solution such as a solution of sodium hydroxide, ammonium hydroxide, tetramethylammonium hydroxide, or the like.

In one embodiment, a reaction vessel is charged first with a mixture of water, alcohol co-dispersing agent, and inorganic co-acid. To this is added, in order, an aniline monomer, and an aqueous dispersion of fluorinated polymeric sulfonic acid colloids, and an oxidizer. The oxidizer is added slowly and dropwise to prevent the formation of localized areas of high ion concentration which can destabilize the acid colloids. The mixture is stirred and the reaction is then allowed to proceed at a controlled temperature. When polymerization is completed, the reaction mixture is treated with a strong acid cation resin, stirred and filtered; and then treated with a base anion exchange resin, stirred and filtered. Alternative orders of addition can be used, as discussed above.

In another embodiment, more conductive dispersions are formed by the addition of highly conductive additives to the aqueous dispersions of polyaniline and the colloid-forming polymeric acid. Because dispersions with relatively high pH can be formed, the conductive additives, especially metal additives, are not attacked by the acid in the dispersion. Moreover, because the polymeric acids are colloidal in nature, having the surfaces predominately containing acid groups, electrically conducting polyaniline is formed on the colloidal surfaces. Because of this unique structure, only a low weight percentage of highly conductive additives is needed to reach the percolation threshhold. Examples of suitable conductive additives include, but are not limited to metal particles and nanoparticles, nanowires, carbon nanotubes, graphite fibers or particles, carbon particles, and combinations thereof.

In another embodiment of the invention, there are provided buffer layers cast from aqueous dispersions comprising polymeric aniline and colloid-forming polymeric acids. In one embodiment, the buffer layers are cast from aqueous dispersions comprising colloid-forming polymeric sulfonic acid. In one embodiment, the buffer layer is cast from an aqueous dispersion containing polyaniline and fluorinated polymeric acid colloids. In another embodiment, the fluorinated polymeric acid colloids are fluorinated polymeric sulfonic acid colloids. In still another embodiment, the buffer layer is cast from an aqueous dispersion containing polyaniline and perfluoroethylenesulfonic acid colloids.

The dried films of polyaniline and polymeric acid colloids, such as fluorinated polymeric sulfonic acid colloids, are generally not redispersible in water. Thus the buffer layer can be applied as multiple thin layers. In addition, the buffer layer can be overcoated with a layer of different water-soluble or water-dispersible material without being damaged.

In another embodiment, there are provided buffer layers cast from aqueous dispersions comprising polymeric aniline and colloid-forming polymeric acids blended with other water soluble or dispersible materials. Examples of types of materials which can be added include, but are not limited to polymers, dyes, coating aids, organic and inorganic conductive inks and pastes, charge transport materials, crosslinking agents, and combinations thereof. The other water soluble or dispersible materials can be simple molecules or polymers. Examples of suitable polymers include, but are not limited to, conductive polymers such as polythiophenes, polyanilines, polypyrroles, polyacetylenes, and combinations thereof.

In another embodiment of the invention, there are provided electronic devices comprising at least one electroactive layer (usually a semiconductor conjugated polymer) positioned between two electrical contact layers, wherein at least one of the layers of the device includes the buffer layer of the invention. As shown in FIG. 1, a typical device has an anode layer 110, a buffer layer 120, an electroluminescent layer 130, and a cathode layer 150. Adjacent to the cathode layer 150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline, polythiophene, or polypyrrole. The IUPAC number system is used throughout, where the groups from the Periodic Table are numbered from left to right as 1-18 (CRC Handbook of Chemistry and Physics, 81$^{st}$ Edition, 2000).

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 is usually cast onto substrates using a variety of techniques well-known to those skilled in the art. Typical casting techniques include, for example, solution casting, drop casting, curtain casting, spin-coating, screen printing, inkjet printing, and the like. Alternatively, the buffer layer can be patterned using a number of such processes, such as ink jet printing.

The electroluminescent (EL) layer 130 may typically be a conjugated polymer, such as poly(paraphenylenevinylene), abbreviated as PPV, or polyfluorene. The particular material chosen may depend on the specific application, potentials used during operation, or other factors. The EL layer 130 containing the electroluminescent organic material can be applied from solutions by any conventional technique, including spin-coating, casting, and printing. The EL organic materials can be applied directly by vapor deposition processes, depending upon the nature of the materials. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal-chelated oxinoid compounds (e.g., Alq$_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

The different layers may have any suitable thickness. Inorganic anode layer 110 is usually no greater than approximately 500 nm, for example, approximately 10-200 nm; buffer layer 120, is usually no greater than approximately 250 nm, for example, approximately 50-200 nm; EL layer 130, is usually no greater than approximately 1000 nm, for example, approximately 50-80 nm; optional layer 140 is usually no greater than approximately 100 nm, for example, approximately 20-80 nm; and cathode layer 150 is usually no greater than approximately 100 nm, for example, approximately 1-50 nm. If the anode layer 110 or the cathode layer 150 needs to transmit at least some light, the thickness of such layer may not exceed approximately 100 nm.

Depending upon the application of the electronic device, the EL layer 130 can be a light-emitting layer that is activated by signal (such as in a light-emitting diode) or a layer of material that responds to radiant energy and generates a signal with or without an applied potential (such as detectors or voltaic cells). Examples of electronic devices that may respond to radiant energy are selected from photoconductive cells, photoresistors, photoswitches, biosensors, phototransistors, and phototubes, and photovoltaic cells. After reading this specification, skilled artisans will be capable of selecting material(s) that are suitable for their particular applications. The light-emitting materials may be dispersed in a matrix of another material, with or without additives, or form a layer alone. The EL layer 130 generally has a thickness in the range of approximately 50-500 nm.

In organic light emitting diodes (OLEDs), electrons and holes, injected from the cathode 150 and anode 110 layers, respectively, into the EL layer 130, form negative and positively charged polarons in the polymer. These polarons migrate under the influence of the applied electric field, forming a polaron exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

OLEDs provided with buffer layers cast from aqueous dispersions comprising polymeric aniline and colloid-forming polymeric acids have been found to have improved lifetimes. The buffer layer may be cast from an aqueous dispersion of polyaniline and fluorinated polymeric sulfonic acid colloids; and in one embodiment the an aqueous dispersion is one in which the pH has been adjusted to above about 3.5.

Using a less acidic or pH neutral material leads to significantly less etching of the ITO layer during device fabrication and hence much lower concentration of In and Sn ions diffusing into the polymer layers of the OLED. Since In and Sn ions are suspected to contribute to reduced operating lifetime this is a significant benefit.

The lower acidity also reduces corrosion of the metal components of the display (e.g. electrical contact pads) during fabrication and over the long-term storage. PANI/PSSA residues will interact with residual moisture to release acid into the displays with resulting slow corrosion.

The buffer layers of the invention have lower moisture uptake and thus less water is included in the device fabrication process. This lower moisture level can also result in better operating lifetime for the device and reduced corrosion.

Equipment used to dispense the acidic PANI/PSSA needs to be specially designed to handle the strong acidity of PANI/PSSA. For example, a chrome-plated slot-die coating-head used to coat the PANI/PSSA onto ITO substrates was found to be corroding due to the acidity of the PANI/PSSA. This rendered the head unusable since the coated film became contaminated with particles of chrome. Also, certain ink-jet print heads are of interest for the fabrication of OLED displays. They are used for dispensing both the buffer layer and the light-emitting polymer layer in precise locations on the display. These print-heads contain nickel mesh filters as an internal trap for particles in the ink. These nickel filters are decomposed by the acidic PANI/PSSA and rendered unusable. Neither of these corrosion problems will occur with the aqueous PANI dispersions of the invention in which the acidity has been lowered.

Furthermore, certain light-emitting polymers are found to be sensitive to acidic conditions, and their light-emitting capability is degraded if they are in contact with an acidic buffer layer. It is advantageous to use the aqueous PANI dispersions of the invention to form the buffer layer because of the lower acidity or neutrality.

The fabrication of full-color or area-color displays using two or more different light-emitting materials becomes complicated if each light-emitting material requires a different cathode material to optimize its performance. Display devices are made up of a multiplicity of pixels which emit light. In multicolor devices there are at least two different types of pixels (sometimes referred to as sub-pixels) emitting light of different colors. The sub-pixels are constructed with different light-emitting materials. It is very desirable to have a single cathode material that gives good device performance with all of the light emitters. This minimizes the complexity of the device fabrication. It has been found that a common cathode can be used in multicolor devices where the buffer layer is made from the aqueous PANI dispersions of the invention while maintaining good device performance for each of the colors. The cathode can be made from any of the materials discussed above; and may be barium, overcoated with a more inert metal such as aluminum.

Other organic electronic devices that may benefit from having one or more layers comprising the aqueous dispersion of polyaniline and at least one colloid-forming polyermic acids include (1) devices that convert electrical energy into radiation (e.g., a light-emitting diode, light emitting diode display, or diode laser), (2) devices that detect signals through electronics processes (e.g., photodetectors (e.g., photoconductive cells, photoresistors, photoswitches, phototransistors, phototubes), IR detectors), (3) devices that convert radiation into electrical energy, (e.g., a photovoltaic device or solar cell), and (4) devices that include one or more electronic components that include one or more organic semi-conductor layers (e.g., a transistor or diode).

The buffer layer can further be overcoated with a layer of conductive polymer applied from aqueous solution or solvent. The conductive polymer can facilitate charge transfer and also improve coatability. Examples of suitable conductive polymers include, but are not limited to, polyanilines, polythiophenes, polythiophene-polymeric-acid-colloids such as those disclosed in co-pending application Dupont number PE 0688, or polythiophene/polystyrenesulfonic acid, polypyrroles, polyacetylenes, and combinations thereof.

In yet another embodiment of the invention, there are provided thin film field effect transistors comprising electrodes comprising polyaniline and colloid-forming polymeric sulfonic acids. For use as electrodes in thin film field effect transistors, the conducting polymers and the liquids for dispersing or dissolving the conducting polymers must be compatible with the semiconducting polymers and the solvents for the semiconducting polymers to avoid re-dissolution of either conducting polymers or semiconducting polymers. Thin film field effect transistor electrodes fabricated from conducting polymers should have a conductivity greater than 10 S/cm. However, electrically conducting polymers made with water soluble polymeric acids only provide conductivity in the range of ~$10^{-3}$ S/cm or lower. Thus, in one embodiment, the electrodes comprise polyaniline and fluorinated colloid-forming polymeric sulfonic acids in combination with electrical conductivity enhancers such as nanowires, carbon nanotubes, or the like. In still another embodiment, the electrodes comprise polyniline and colloid-forming perfluoroethylenesulfonic acid in combination with electrical conductivity enhancers such as nanowires, carbon nanotubes, or the like. Invention compositions may be used in thin film field effect transistors as gate electrodes, drain electrodes, or source electrodes.

Figure 2:
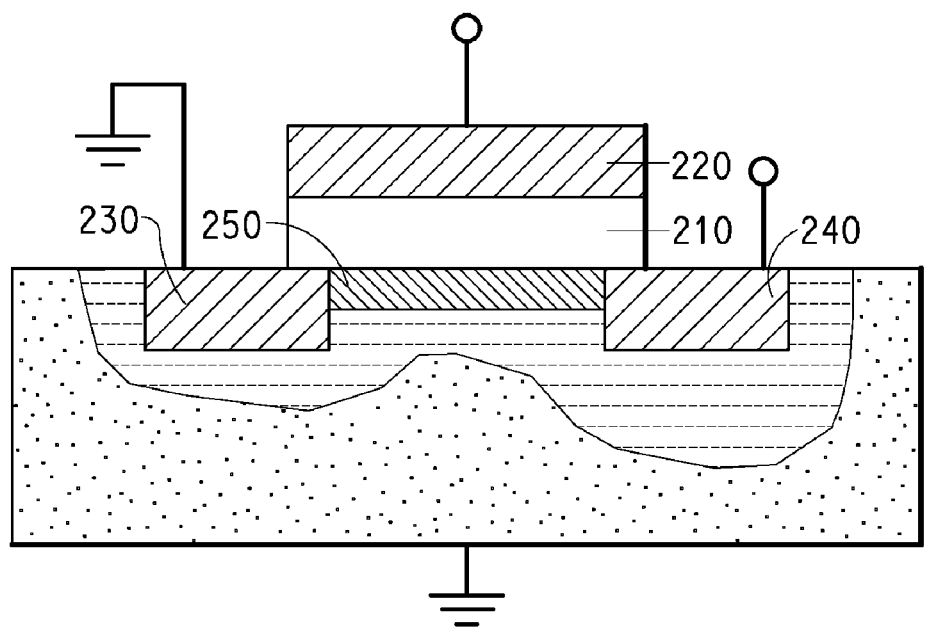
FIG. 2 illustrates a cross-sectional view of a thin film field effect transistor that includes an electrode according to the invention.

Thin film field effect transistors, as shown in FIG. 2, are typically fabricated in the following manner. A dielectric polymer or dielectric oxide thin film 210 has a gate electrode 220 on one side and drain and source electrodes, 230 and 240, respectively, on the other side. Between the drain and source electrode, an organic semiconducting film 250 is deposited. Invention aqueous dispersions containing nanowires or carbon nanotubes are ideal for the applications of gate, drain and source electrodes because of their compatibility with organic based dielectric polymers and semiconducting polymers in solution thin film deposition. Since the invention conducting compositions, e.g., PANI and colloidal perfluoroethylene sulfonic acid, exist as a colloidal dispersion, less weight percentage of the conductive fillers is required (relative to compositions containing water soluble polymeric sulfonic acids) to reach percolation threshold for high electrical conductivity.

In still another embodiment of the invention, there are provided methods for producing, aqueous dispersions of polyaniline comprising polymerizing aniline monomers in the presence of polymeric acid colloids. In another embodiment, the colloid-forming polymeric acid is carboxylic acid, acrylic acid, sulfonic acid, phosphoric acid, or the like, or combination of above. In one embodiment of the invention methods, the polyaniline is a polyaniline and the colloid-forming polymeric acid is fluorinated. In another embodiment of the invention methods, the polyaniline is unsubstituted polyaniline and the colloid-forming polymeric acid is perfluorinated. In still another embodiment, the colloid-forming acid is polyethylenesulfonic acid. In still another embodiment, the polyethylenesulfonic acid is perfluorinated. The polymerization is carried out in water. In still another embodiment, the perfluoroethylenesulfonic acid containing polymerization is carried out with an additional acid as set forth above. The resulting reaction mixture can be treated with ion exchange resins to remove reaction byproducts and attainment of a desired pH aqueous dispersion. In another embodiment, the pH can be further adjusted with ion exchangers or a basic aqueous solution.

The invention will now be described in greater detail by reference to the following non-limiting examples.

EXAMPLES

Comparative Example 1

This comparative example illustrates high moisture uptake, and re-dispersibility of dried solids prepared from D 005 W OLD of Ormecon Company. It also illustrates acidity of the water in contact with the dried films.

D1005 W LED purchased from Ormecon Chemie GmbH and Co. KG (Ammersbeck, Germany) is aqueous polyaniline dispersion. The polyaniline polymer was produced from the polymerization of aniline and a water soluble poly(styrene-sulfonic acid). About 15 ml of the aqueous dispersion was dried with a flowing stream of nitrogen. 0.05 g of the dried polymer films was mixed with 0.45 g deionized water having a pH of 7. The pH was measured with a piece of Color pHast.® indicator strip (EM Science, pH 0-14 range, Cat #9590). The color of the wet strip was compared with the color chart for reading of pH. As soon as the polymer films were in contact with the de-ionized water, the water turned dark green and soon later dispersed completely in the water. PH of the water was about 1, which is very acidic. The dried film also picked up about 24% moisture at ambient conditions (~25'C/50% RH). This example illustrates that polyaniline made with a water soluble polymeric acid disperses readily in water forming a low pH of dispersion. It also picks up a substantial amount of moisture. All the results show that the acid is very mobile and has high propensity of migrating into adjacent polymer layers, such as light polymer layer, to damage their function.

Comparative Example 2

This comparative example illustrates re-dispersibility of dried solids prepared from an aqueous PAni/PAAMPSA dispersion in which the dispersed polyaniline is made with aniline and a water soluble PAAMSA. It also illustrates acidity of the aqueous dispersion.

60.65 g (43.90 mmoles of acid monomer units) aqueous PAAMPSA solution (Aldrich, Cat #19, 197-3, lot #07623EO, $M_w$~2 million, 15% solid in water) was introduced into a jacketed 500 ml three-necked flask, followed by 335.07 g de-ionized water. The flask was equipped with a stirring paddle powered by an air-driven overhead stirrer and a small tube for adding ammonium persulfate. The small tube was placed inside a glass pipette with the tip removed and the pipette was inserted through a 29 size septa so that the end of the tube extended out of the pipette approximately ½" above the reaction mixture. A thermocouple with an inlet for monitoring the temperature of the polymerization liquid in the jacketed flask was used to keep circulation of the fluid at 22° C. After stirring of the PAAMPSA/water mixture commenced, freshly distilled aniline (4.0 mL, 43.9 mmoles) was added to the flask via a transfer pipette. The mixture was allowed to mix with stirring for approximately one hour. While stirring continued, ammonium persulfate (4.01 g, 17.572 mmoles, 99.999+% pure from Aldrich) was massed into a scintillation vial, and the mass was mixed with 16.38 g de-ionized water. This mixture was placed in a Norm-Ject 30 ml syringe, which was connected to the tube in the flask using a 17-gauge syringe needle. The syringe was connected to a Harvard Apparatus 44 Syringe Pump programmed to add the ammonium persulfate (APS) over 30 minutes. During the addition of APS, temperature of the mixture was about 23° C. The reaction mixture turned blue one minute after addition of APS began and started to darken. After addition of the APS solution was completed, the reaction was allowed to proceed for 24 hours with constant stirring.

After 24 hours, the reaction mixture was poured into a 4 L plastic Nalgen® beaker, agitation from the overhead stirrer was started, and acetone (2000 L) was poured into the 4 L beaker. Stirring of the acetone mixture continued for 30 minutes. Once stirring was stopped, the mixture was allowed to settle into two layers. Most of the reddish-yellow liquid phase was decanted, leaving behind a tarry solid product, which was then transferred to an Erlenmeyer flask. The flask was positioned in such a way that the stirring blade could be used for agitation. Another 430 ml of fresh acetone was quickly added to the beaker. This was allowed to stir for 15 minutes. This produced slurry, which was allowed to stand for about 30 minutes before being suctioned filtered through a Buchner funnel equipped with one piece of Whatman #54 filter paper. The mother liquid was clear and colorless. Another 430 ml of fresh acetone was quickly added to the product. This was allowed to stir for approximately 90 minutes. This slurry was allowed to stand for about four hours before being suction-filtered through a Buchner funnel equipped with one piece of Whitman #54 filter paper. while a greenish solid product collected on the filter paper. The filtrate had a very light green color associated with it. The filtered cake had fine particles, but a few large size particles. The funnel and its contents were placed into a vacuum oven (~20 inch mercury, ambient temperature) for about two days. Yield was 11.93 g.

0.31 g of the PAni/PAAMPSA powder made above was mixed with 20.38 g deionized water. The polymer powder dispersed in the water very quickly to form 1.5% (w/w) dispersion. 1.5 g of the dispersion was mixed with 3.0 g deionized water for pH test using a piece of Color pHast.® indicator strip described above. pH of the dispersion is about 3. This example illustrates that polyaniline made with a water soluble polymeric acid disperses readily in water forming a low pH of dispersion. The results show that the acid is very mobile and has propensity of migrating into adjacent polymer layers, such as light polymer layer, to damage their function.

Example 1

This example illustrates preparation of an aqueous PAni/Nafion® dispersion in which the dispersed polyaniline is made with aniline and Nafion®, a colloidal perfluoroethylenesulfonic acid. This example also illustrates non-dispersibility and low moisture uptake of the dried solids prepared from the aqueous PAni/Nafion® dispersion. It also illustrates neutrality of the water in contact with the dried films.

A Nafion® polymer dispersion made according to the method described in U.S. Pat. No. 6,150,426 patent issued in Nov. 21, 2000 was used in this invention. The Nafion® polymer dispersion sample contains 12.0% (w/w) perfluoroethylenesulfonic acid colloids in water and the Nafion® polymer has 1050 g/mole of monomer unit of acid. 191.63 g (21.90 mmoles of Nafion® monomer units) of the Nafion® polymer dispersion and 206.32 g de-ionized water were poured into a jacketed 500 ml three-necked flask. The flask was equipped with a stirring paddle powered by an air-driven overhead stirrer and a small tube for ammonium persulfate. The small tube was placed inside of a glass pipette with the tip removed. This was put through a 29 size Septa so that the tube was extended out of the pipette approximately ½" above the reaction mixture. A thermal couple has its own inlet for monitoring temperature of polymerization liquid in the jacketed flask allowing circulation of 20° C. fluid. Stirring of the Nafion®/water mixture then commenced. 2.0 ml (21.9 mmoles aniline) distilled aniline was then added via a transfer pipette. This was allowed to stir for a period of approximately one hour. While stirring, 2.02 g (8.852 mmoles) ammonium persulfate (99.999+% pure from Aldrich) was massed into a Scintillation Vial. The mass was then mixed with 8.16 g deionized water. This was then sucked into a Norm-Ject 30 ml syringe, which was hooked to the aforementioned tube using a 17-gauge syringe needle. The syringe was hooked to a Harvard Apparatus 44 Syringe Pump. The Syringe Pump was set up in such way that the ammonium persulfate (APS) was added in 30 minutes, but actual addition time was 28 minutes. During the polymerization, temperature was about 20° C. The reaction mixture was very foamy and turned blue within 20 minutes of APS addition. Within one hour, the polymerization was already very dark in color and appeared to be very homogeneous. The polymerization was allowed to proceed for about 25 hours and the entire content of polymerization liquid was poured into a 1 liter Erlenmeyer flask.

The polymerization liquid is dark green in color, expected color for electrically conducting polyaniline. The liquid was left un-disturbed for 44 hours. It was surprised to discover that the polymerization liquid did not separate into two phases, meaning a clear liquid layer on the top and green precipitate on the bottom. This result clearly shows that a stable aqueous dispersion of polyaniline/Nafion® has been made.

The polymerization liquid was then suction-filtered through a Buchner Funnel containing two pieces of Whatman #54 filter paper. When the filtrate started to go through, it was dark green in color and became less color due to blinding of the filter paper. The filtration became extremely slow, therefore filter paper had to be changed several times. The collected filter cake, while still wet, was re-dispersed in 400 ml de-ionized water. Filtration was done in the same manner and the collected filtration cake, while still wet, was re-dispersed in 300 ml deionized water.

Portion of the 300 ml PAni/Nafion* dispersion was left undisturbed for one week. Once again, there is no separation of the dispersion into a clear liquid phase although there were some green precipitates on the bottom. Portion of the dispersion was dried with a flowing stream of nitrogen to form solid films for solid percentage. It was determined to be 3.2%. The dried films were then ground into fine powder, which is very dark green. TGA shows that the dried powder only picks up 1.7% moisture while equilibrating at 25° C./50% RH.

0.1255 g of the PAni/Nafion® powder was mixed with 4.8770 g de-ionized, neutral water and stirred with a shaker. The PAni/Nafion® polymer powder remains intact without discoloring the water. pH of the water remains neutral when tested with a piece of pHastt® litmus paper. This result clearly shows that the polymeric aid remains in the polymer even in contact with water, which remains neutral.

Example 2

This example illustrates preparation of an aqueous PAni/Nafion® dispersion and effect of resin treatment on dispersion stability and pH. This example also illustrates non-dispersibility and low moisture uptake of the dried solids prepared from the aqueous PAni/Nafion® dispersion. It also illustrates neutrality of the water in contact with the dried films.

In this invention example, SE10072 Nafion® was used for polymerization with aniline. The Nafion® is commercially available from E. I. Dupont de Nemours & Company, Delaware, USA. Nafion® in SE10072 has colloid size in the range of 40 nm to 140 nm as opposed to the Nafion® used in invention Example 1, which has colloid size in the range of 2 to 30 nm cited in U.S. Pat. No. 6,150,426 patent issued in Nov. 21, 2000.

The polymerization procedure described in invention Example 1 for making PAni/Nafion® was followed closely. A SE 10072 Nafion® colloidal dispersion used in this example contains 11.2% (w/w) perfluoroethylenesulfonic acid colloids in water. The Nafion® polymer has about 920 g/mole of monomer unit of acid. 97.29 g (11.84 mmoles of Nafion® monomer units) of the Nafion® dispersion and 296.15 g de-ionized water were poured into a jacketed 500 ml three-necked flask. Stirring of the Nafion®/water mixture then commenced while 20° C. fluid was circulated continuously through the jacketed flask. 1.079 ml (11.84 mmoles) distilled aniline was then added to the flask via a transfer pipette. This was allowed to stir for a period of one hour. While stirring, 1.08 g (4.73 mmoles) ammonium persulfate (99.999+% pure from Aldrich) was massed into a Scintillation Vial. The mass was then mixed with 4.38 g deionized water. The ammonium persulfate solution was added to the reaction mixture in 34 minutes. During the polymerization, temperature was about 20.4° C. The reaction mixture was foamy. Within one hour, the polymerization was already very dark green in color and appeared to be inhomogeneous. A small drop of the polymerization was placed on a microscope slide, which formed a very rough film once dried. The polymerization was allowed to proceed for about 24.5 hours. The polymerization liquid was emptied from the reactor to two plastic bottles. One portion weighed 184 g; the other weighed 203 g. The 184 g portion was left standing overnight. It separated into two layers. The top layer is clear liquid, but the bottom layer is dark green precipitation.

The 203 g portion of the polymerization liquid was mixed with 7.69 g Dowex® 550A and 7.94 g Dowex® 66 were added to the reaction flask and left stirred for 20 hours. Dowex 550A is a quaternary amine anion exchange resin and Dowex®66 is a tertiary amine ion exchange resin (Dow Chemical Company, MI). The resins were washed repeatedly with deionized water until there was no color or odor in the water washings prior to use. The resin-treated slurry was then pre-filtered through a Cheese Cloth directly into a 1-liter beaker. A second filtration was done through a 500-mesh stainless steel. The filtrate was stable and could go through 0.45-micron dp filter (Whatman 25 mm GDX, Catalog number: 6992-2504). The pH of the filtered dispersion was measured with a pH meter model 63 from Jenco Electronics, Inc. and was found to be 7.4. The resin-treatment evidently rendered the PAni/Nafion® polymerization liquid into a stable dispersion. It should be also understood that pH of the polymerization liquid can be adjusted from ~1.5 to any pH below neutrality depending on amount of ion exchange resins used and resin-treatment time. 1.5 is typical pH for the liquid derived from the polymerization of 1 mole aniline/1 mole Nafion®/0.4 mole ammonium persulfate, A small portion of the resin-treated PAni/Nafion® was dried with flowing nitrogen until a constant weight. It was then left equilibrated at ambient room temperature to absorb moisture. Moisture uptake was determined to be 3.6%. The dried solid did not re-disperse in water and the water in contact with the solid had a ph of 7, measured with a pH meter model 63 from Jenco Electronics, Inc.

Example 3

This example illustrates preparation of a high pH aqueous PAni/Nafion® dispersion and device properties.

In this invention example, SE10072 Nafion® was used for polymerization with aniline. The Nafion® is commercially available from E. I. Dupont de Nemours & Company, Delaware, USA. The Nafion® in SE10072 has colloid size in the range of 40 nm to 140 nm as opposed to the Nafion® used in invention Example 1, which has colloid size in the range of 2 to 30 nm cited in U.S. Pat. No. 6,150,426 patent issued in Nov. 21, 2000.

The polymerization procedure described in invention Example 1 for making PAni/Nafion® was followed closely. A SE10072 Nafion® colloidal dispersion used in this example contains 11.2% (w/w) perfluoroethylenesulfonic acid colloids in water. The Nafion® polymer has about 920 g/mo1e.of monomer unit of acid. 194.6 g (23.69 mmoles of Nafion® monomer units) of the Nafion® dispersion and 602.28 g de-ionized water were poured into a jacketed one liter three-necked flask. Stirring of the Nafion®/water mixture then commenced while 20° C. fluid was circulated continuously through the jacketed flask. 2.159 ml (23.69 mmoles) distilled aniline was then added to the flask via a transfer pipette. This was allowed to stir for a period of one hour. While stirring, 2.18 g (9.553 mmoles) ammonium persulfate (99.999+% pure from Aldrich) was massed into a Scintillation Vial. The mass was then mixed with 8.74 g deionized water. The ammonium persulfate solution was added to the reaction mixture in 30 minutes. During the polymerization, temperature was about 20.4° C. The reaction mixture was very foamy. Within one hour, the polymerization was already very dark green in color and appeared to be very homogeneous. The polymerization was allowed to proceed for about 24 hours. 18.82 g Dowex® 550A and 14.88 g Dowex® 66 were added to the reaction flask and left stirred for 4.4 hours. Dowex 550A is a quaternary amine anion exchange resin and Dowex®66 is a tertiary amine ion exchange resin (Dow Chemical Company, MI). The resins were washed repeatedly with deionized water until there was no color or odor in the water washings prior to use. The resin-treated slurry was then pre-filtered through a Cheese Cloth directly into a 1-liter beaker. A second filtration was done through a 500-mesh stainless steel. Yield: 670.80 g.

About 30 ml of the dispersion sample prepared above was filtered through 0.45 micron dp filter (Whatman 25 mm GDX, Catalog number: 6992-2504). The pH of the filtered dispersion was measured with a pH meter model 63 from Jenco Electronics, Inc. and was found to be 7.4.

For light emission measurement, the aqueous PAni/Nafion® dispersion having pH of 7.2 was spin-coated onto ITO/glass substrates at a spinning speed of 800 rpm to yield a thickness of 1000 Å. The PAni/Nafion®coated ITO/glass substrates were dried in nitrogen at 90° C. for 30 minutes. The PAni/Nafion® layers were then top-coated with a super-yellow emitter (PDY 131), which is a poly(substituted-phenylene vinylene) (Covion Company, Frankfurt, Germany). The thickness of the electroluminescent (EL) layer was approximately 70 nm. Thickness of all films was measured with a TENCOR500 Surface Profiler. For the cathode, Ba and Al layers were vapor-deposited on top of the EL layers under a vacuum of $1 \times 10^{-6}$ torr. The final thickness of the Ba layer was 30 Å; the thickness of the Al layer was 3000 Å. Device performance was tested as follows. Current vs. voltage, light emission intensity vs. voltage, and efficiency were measured with a 236 source-measure unit (Keithley) and a S370 Optometer with a calibrated silicon photodiode (UDT Sensor). One light-emitting device showed an operating voltage of 3.65 volt and light emission efficiency is 7.2 Cd/A (Cd: candela; A: amperage) light emission efficiency at 200 $Cd/m^2$.

Example 4

92.00 g of DI water and 92.00 g of 99.7% n-propanol were massed directly into a 500 mL double-jacketed reactor vessel at room temperature. Next, 3.58 mL (43.59 mmol) of 37% wt. HCl and 1.988 mL (21.80 mmol) of aniline (distilled) were added to the reactor via pipet. The mixture was stirred overhead with a U-shaped stir-rod set at 500 RPM. After five minutes, 91.98 g (10.90 mmol) of water-dispersed Nafion® (DE-1020, 10.9% solids, 920 EW) that had been passed through a 0.3 μm profile filter, was added slowly via glass funnel. The mixture was allowed to homogenize for an additional five minutes. 1.99 g (8.72 mmol) of ammonium persulfate (99.99+%) dissolved in 20 g of DI water was added drop wise to the reactants via syringe infusion pump over one hour. Eight minutes later the solution turned light turquoise. The solution progressed to being dark blue before turning very dark green. After the APS addition began, the mixture was stirred for 90 minutes and 7.00 g of Amberlyst-15 (Rohm and Haas Co., Philadelphia, Pa.) cation exchange resin (rinsed multiple times with a 32% n-propanol (in DI water) mixture and dried under nitrogen) was added and the stirring commenced overnight at 200 RPM. The next morning, the mixture was filtered through steel mesh and stirred with Amberjet 4400 (OH) (Rohm and Haas Co., Philadelphia, Pa.) anion exchange resin (rinsed multiple times with a 32% n-propanol (in DI water) mixture and dried under nitrogen) until the pH had changed from 0.9 to 4.4. The resin was again filtered off. Before use, the dispersion was filtered through a 0.45 μm Millipore Millex-HV syringe filter with PVDF membrane. Yield: approximately 300 g dispersion with 4% solids in 32% n-propanol/68% DI water.

The dispersions were spun onto glass at 1600 RPM, resulting in films having a thickness of 1151 Å. The conductivity was $1.36 \times 10^{-5}$ S/cm Devices were made as described in Example 3. The devices had the performance given below, where $t_{1/2}$ is the time of continuous operation after which the brightness is one-half the initial brightness, at the temperature indicated:
voltage and efficiency at 600 cd/m$^2$: 3.45 V and 9.8 cd/A;
leakage current at −7V: 2 μA;
$T_{1/2}$ at 80° C. (initial brightness: 412 cd/m$^2$): 97 hrs.

Example 5

88.11 g of 99.7% n-propanol and 88.11 g of DI water were massed directly into a 500 mL double-jacketed reactor vessel at room temperature. Next, 0.167 mL (2.0 mmol) of 37% wt. HCl and 0.901 mL (9.9 mmol) of aniline (distilled) were added to the reactor via pipet. The mixture was stirred overhead with a U-shaped stir-rod set at 500 RPM. After five minutes, 100.03 g (11.90 mmol) of water-dispersed Nafion® (DE-1020, 11.1% solids, 935 EW) that had been passed through a 0.3 μm profile filter, was added slowly via glass funnel. The mixture was allowed to homogenize for an additional 10 minutes. 2.82 g (12.4 mmol) of ammonium persulfate (99.99+%) dissolved in 20 g of DI water was added drop wise to the reactants via syringe infusion pump over six hours. Seven minutes later the solution turned light turquoise. The solution progressed to being dark blue before turning very dark green. After the APS addition began, the mixture was stirred for 360 minutes and 7.50 g of Amberlyst-15 cation exchange resin (rinsed multiple times with a 32% n-propanol (in DI water) mixture and dried under nitrogen) was added and the stirring commenced overnight at 200 RPM. The next morning, the mixture was filtered through steel mesh and stirred with Amberjet 4400 (OH) anion exchange resin (rinsed multiple times with a 32% n-propanol (in DI water) mixture and dried under nitrogen) until the pH had changed from 1.3 to 4.8. The resin was again filtered off. Before use, the dispersion was filtered through a 0.45 μm Millipore Millex-HV syringe filter with PVDF membrane. Yield: approximately 270 g dispersion with 4% solids in 31% n-propanol/69% DI water.

The dispersions were spun onto glass at 1000 RPM, resulting in films having a thickness of 2559 Å. The conductivity was $1.67 \times 10^{-6}$ S/cm.

Devices were made as described in Example 3. The devices had the following performance:
voltage and efficiency at 600 cd/m$^2$: 3.56 V and 10.3 cd/A;
leakage current at −7V: 6 μA;
$T_{1/2}$ at 80° C. (initial brightness: 490 cd/m$^2$): 148 hrs.

While the invention has been described in detail with reference to certain preferred embodiments thereof, it will be understood that modifications and variations are within the spirit and scope of that which is described and claimed.

What is claimed is:

1. A method of making an aqueous dispersion of polyaniline and at least one colloid-forming fluorinated sulfonic acid polymeric acid including the step of forming a combination of water, aniline monomer, colloid-forming fluorinated sulfonic acid polymeric acid, and oxidizer, in any order, provided that at least a portion of the colloid-forming fluorinated sulfonic acid polymeric acid is present when at least one of the aniline monomer and the oxidizer is added.

2. A method according to claim 1 wherein said aniline monomer has Formula I

wherein:
n is an integer from 0 to 4;
m is an integer from 1 to 5, with the proviso that n+m=5; and
$R^1$ is independently selected so as to be the same or different at each occurrence and is selected from alkyl, alkenyl, alkoxy, cycloalkyl, cycloalkenyl, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

3. A method according to claim 2 wherein m is 5.

4. A method according to claim 1 wherein said polymeric acid is a perfluorinated sulfonic acid.

5. A method according to claim 4, wherein said polymeric acid is perfluoroethylenesulfonic acid.

6. A method according to claim 1, wherein the oxidizer is selected from ammonium persulfate, sodium persulfate, potassium persulfate, and mixtures thereof.

7. A method according to claim 1, wherein the combination further comprises a catalyst.

8. A method according to claim 7, wherein the catalyst is selected from ferric sulfate, ferric chloride, and mixtures thereof.

9. A method according to claim 1, wherein the combination further comprises a co-dispersing liquid.

10. A method according to claim 9, wherein the co-dispersing liquid is selected from ethers, alcohols, alcohol ethers, cyclic ethers, ketones, nitriles, sulfoxides, amides, and combinations thereof.

11. A method according to claim 10, wherein the combination further comprises a co-acid.

12. A method according to claim 9, wherein the co-dispersing liquid is selected from n-propanol, isopropanol, t-butanol, dimethylacetamide, dimethylformamide, N-methylpyrrolidone, and combinations thereof.

13. A method according to claim 1, wherein the combination further comprises a co-acid.

14. A method according to claim 13, wherein the co-acid is selected from a water-soluble inorganic acid, a water-soluble organic acid, a colloid-forming polymeric acid, and combinations thereof.

15. A method according to claim 1, wherein the method further comprises contacting a reaction product with at least one ion exchange resin.

16. A method according to claim 15, wherein said at least one ion-exchange resin is selected from a cation exchange resin, anionic exchange resin, and mixtures thereof.

17. A method according to claim 15, wherein the aqueous dispersion is contacted with a cation exchange resin and then with an anionic exchange resin.

18. A method according to claim 16, wherein the cation ion exchange resin is selected from sulfonated styrene-divinylbenzene copolymers, sulfonated crosslinked styrene polymers, phenol-formaldehyde-sulfonic acid resins, benzene-formaldehyde-sulfonic acid resins, and mixtures thereof; and the anionic exchange resin is selected from tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof.

19. A method according to claim 17, wherein the cation ion exchange resin is selected from sulfonated styrene-divinylbenzene copolymers, sulfonated crosslinked styrene polymers, phenol-formaldehyde-sulfonic acid resins, benzene-formaldehyde-sulfonic acid resins, and mixtures thereof; and the anionic exchange resin is selected from tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof.

* * * * *